(12) United States Patent
Ando et al.

(10) Patent No.: US 12,273,636 B2
(45) Date of Patent: Apr. 8, 2025

(54) PHOTODETECTION DEVICE AND ELECTRONIC APPARATUS

(71) Applicant: SONY SEMICONDUCTOR SOLUTIONS CORPORATION, Kanagawa (JP)

(72) Inventors: Kengo Ando, Kanagawa (JP); Sachio Akebono, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 173 days.

(21) Appl. No.: 18/002,128

(22) PCT Filed: Jun. 7, 2021

(86) PCT No.: PCT/JP2021/021510
§ 371 (c)(1),
(2) Date: Dec. 16, 2022

(87) PCT Pub. No.: WO2021/261229
PCT Pub. Date: Dec. 30, 2021

(65) Prior Publication Data
US 2023/0232128 A1 Jul. 20, 2023

(30) Foreign Application Priority Data
Jun. 23, 2020 (JP) .................. 2020-108108

(51) Int. Cl.
*H04N 25/616* (2023.01)
*H04N 25/65* (2023.01)
*H04N 25/75* (2023.01)

(52) U.S. Cl.
CPC .......... *H04N 25/616* (2023.01); *H04N 25/65* (2023.01); *H04N 25/75* (2023.01)

(58) Field of Classification Search
CPC ...... H04N 25/616; H04N 25/65; H04N 25/75; H04N 25/78; H04N 25/00; H04N 25/70;
(Continued)

(56) References Cited

U.S. PATENT DOCUMENTS

2015/0123832 A1* 5/2015 Sohn .................. H03K 5/2481
327/56
2015/0326805 A1* 11/2015 Scott .................. H04N 25/778
348/243

(Continued)

FOREIGN PATENT DOCUMENTS

JP  2006-020171 A  1/2006
JP  2006-157263 A  6/2006
(Continued)

OTHER PUBLICATIONS

International Search Report and Written Opinion of PCT Application No. PCT/JP2021/021510, issued on Aug. 10, 2021, 08 pages of ISRWO.

*Primary Examiner* — Albert H Cutler
(74) *Attorney, Agent, or Firm* — CHIP LAW GROUP

(57) ABSTRACT

A photodetection device according to the present disclosure includes: a pixel; a reference signal generation unit; a comparison circuit; and a first switch. The pixel is configured to generate a pixel signal. The reference signal generation unit is configured to generate a reference signal. The comparison circuit includes a first-stage amplifier circuit and a second-stage amplifier circuit that is coupled to the first-stage amplifier circuit through a connection node. The first-stage amplifier circuit is configured to output a first output signal corresponding to a comparison operation based on the pixel signal and the reference signal. The second-stage amplifier circuit is configured to output a second output signal corresponding to the first output signal outputted from the first-stage amplifier circuit through the (Continued)

connection node. The first switch has one end and another end. The one end is coupled to the connection node. The first switch allows impedance and a voltage at the connection node to change.

15 Claims, 36 Drawing Sheets

(58) Field of Classification Search
CPC ...... H04N 25/77; H04N 25/772; H03F 3/082; H03F 3/45183; H03M 1/123; H03M 1/1295; H03M 1/56; H03K 5/08
See application file for complete search history.

(56) References Cited

U.S. PATENT DOCUMENTS

| | | | | |
|---|---|---|---|---|
| 2018/0091752 | A1* | 3/2018 | Ebihara | H04N 25/78 |
| 2019/0058483 | A1* | 2/2019 | Kim | H04N 25/78 |
| 2020/0389617 | A1* | 12/2020 | Totsuka | H01L 27/14612 |
| 2021/0021774 | A1* | 1/2021 | Ebihara | H04N 25/78 |

FOREIGN PATENT DOCUMENTS

| | | |
|---|---|---|
| WO | 2016/163228 A1 | 10/2016 |
| WO | 2018/159343 A1 | 9/2018 |

* cited by examiner

LIGHT PULSE L0

REFLECTION LIGHT PULSE L1

PHOTODETECTION DEVICE AND ELECTRONIC APPARATUS

CROSS REFERENCE TO RELATED APPLICATIONS

This application is a U.S. National Phase of International Patent Application No. PCT/JP2021/021510 filed on Jun. 7, 2021, which claims priority benefit of Japanese Patent Application No. JP 2020-108108 filed in the Japan Patent Office on Jun. 23, 2020. Each of the above-referenced applications is hereby incorporated herein by reference in its entirety.

TECHNICAL FIELD

The present disclosure relates to a photodetection device that is able to detect light and an electronic apparatus including such a photodetection device.

BACKGROUND ART

Some photodetection devices have pixels generate pixel signals corresponding to the amount of received light and have AD (Analog to Digital) conversion circuits convert the pixel signals into digital codes. The photodetection device is applied, for example, to an imaging device. PTL 1 discloses an imaging device that performs AD conversion on the basis of a signal having a ramp waveform and a pixel signal. In addition, PTL 1 discloses technology that reduces noise included in a pixel signal in a CDS (Correlated Double Sampling: correlated double sampling) method.

CITATION LIST

Patent Literature

PTL 1: International Publication No. WO 2018/159343

SUMMARY OF THE INVENTION

It is desired to develop technology that makes it possible to accurately perform a noise reduction process by a CDS method.

It is desirable to provide a photodetection device that makes it possible to accurately perform a noise reduction process and an electronic apparatus.

A photodetection device according to an embodiment of the present disclosure includes: a pixel; a reference signal generation unit; a comparison circuit; and a first switch. The pixel is configured to generate a pixel signal. The reference signal generation unit is configured to generate a reference signal. The comparison circuit includes a first-stage amplifier circuit and a second-stage amplifier circuit that is coupled to the first-stage amplifier circuit through a connection node. The first-stage amplifier circuit is configured to output a first output signal corresponding to a comparison operation based on the pixel signal and the reference signal. The second-stage amplifier circuit is configured to output a second output signal corresponding to the first output signal outputted from the first-stage amplifier circuit through the connection node. The first switch has one end and another end. The one end is coupled to the connection node. The first switch allows impedance and a voltage at the connection node to change.

An electronic apparatus according to an embodiment of the present disclosure includes a photodetection device. The photodetection device includes the photodetection device according to the embodiment of the present disclosure described above.

In the photodetection device or the electronic apparatus according to the respective embodiments of the present disclosure, the one end of the first switch is coupled to the connection node between the first-stage amplifier circuit and the second-stage amplifier circuit. This makes it possible to change the impedance and the voltage at the connection node.

MODES FOR CARRYING OUT THE INVENTION

The following describes embodiments of the present disclosure in detail with reference to the drawings. It is to be noted that description is given in the following order.

1. Embodiment (Imaging Device to which Photodetection Device is Applied)
  1.1 Configuration (FIGS. 1 to 9)
  1.2 Operation and Workings (FIGS. 10A, 10B, 10C, 10D, 11, 12, 13, 14, 15A, 15B, 15C. 16, 17A, 17B, 17C, 18, 19A, 19B, 19C, 19D, 20, 21A, 21B, 22, 23A, 23B, and 23C)
  1.3 Effects
  1.4 Modification Examples (FIGS. 24 to 33)
2. Usage Example of Imaging Device (FIG. 34)
3. Examples of Practical Application to Mobile Body (FIGS. 35 to 36)
4. Example of Practical Application to Distance Measurement Device (FIGS. 37, 38, 39, 40A, and 40B)
5. Other Embodiments 1. Embodiment (Imaging Device to which Photodetection Device is Applied)

An electronic apparatus according to an embodiment of the present disclosure includes a photodetection device. The electronic apparatus corresponds to, for example, a smartphone, a digital camera, a video camera, a notebook personal computer, or the like.

Here, a case where a photodetector according to an embodiment of the present disclosure is applied to an imaging device is described as an example.

1.1 Configuration

Figure 1:
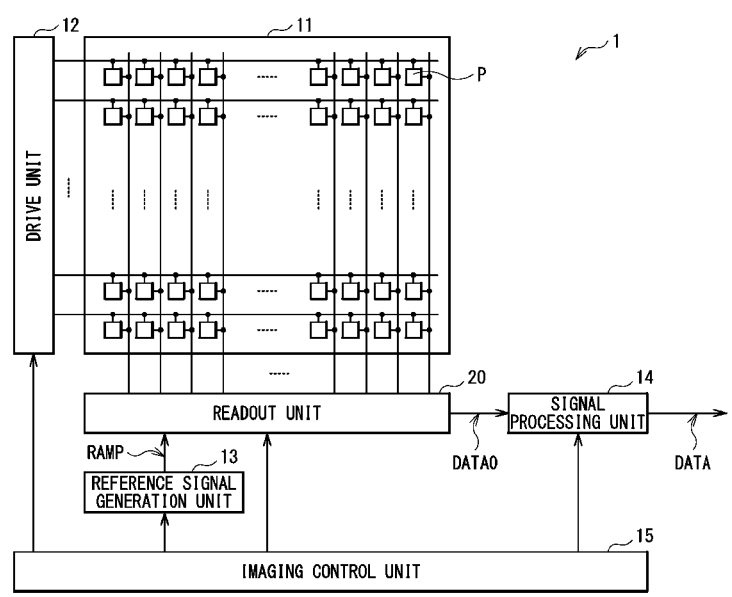
FIG. 1 is a block diagram illustrating a configuration example of an imaging device according to an embodiment of the present disclosure.

FIG. 1 illustrates a configuration example of an imaging device 1 to which a photodetection device according to an embodiment is applied. The imaging device 1 includes a pixel array 11, a drive unit 12, a reference signal generation unit 13, a readout unit 20, a signal processing unit 14, and an imaging control unit 15.

The pixel array 11 includes a plurality of pixels P disposed in a matrix. Each of the pixels P is configured to generate a pixel voltage Vpix corresponding to the amount of received light.

Figure 2:
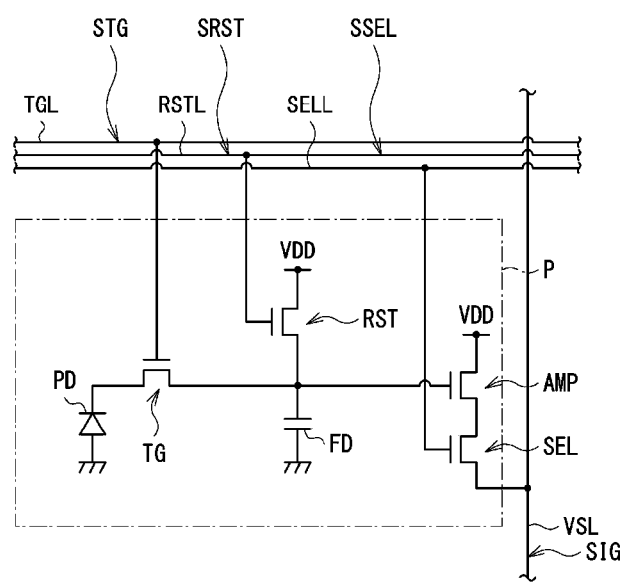
FIG. 2 is a circuit diagram illustrating a configuration example of a pixel of the imaging device according to the embodiment.

FIG. 2 illustrates a configuration example of the pixel P in the imaging device 1. The pixel array 11 includes a plurality of control lines TGL, a plurality of control lines RSTL, a plurality of control lines SELL, and a plurality of signal lines VSL. Each of the control lines TGL extends in the horizontal direction (the lateral direction in FIG. 2) and one end thereof is coupled to the drive unit 12. This control line TGL is supplied with a control signal STG by the drive unit 12. Each of the control lines RSTL extends in the horizontal direction and one end thereof is coupled to the drive unit 12. This control line RSTL is supplied with a control signal SRST by the drive unit 12. Each of the control lines SELL extends in the horizontal direction and one end thereof is coupled to the drive unit 12. This control line SELL is supplied with a control signal SSEL by the drive unit 12. Each of the signal lines VSL extends in the vertical direction (the longitudinal direction in FIG. 2) and one end thereof is coupled to the readout unit 20. This signal lines VSL each transmit a signal SIG generated by the pixel P to the readout unit 20. The plurality of pixels P provided side by side in one row in the horizontal direction (the lateral direction in each of FIGS. 1 and 2) is included in a pixel line L.

Each of the pixels P includes a photodiode PD, a transistor TG, a floating diffusion FD, and transistors RST, AMP, and SEL. Each of the transistors TG, RST, AMP, and SEL is an N-type MOS (Metal Oxide Semiconductor) transistor in this example.

The photodiode PD is a photoelectric conversion element that generates the amount of electric charge corresponding to the amount of received light and accumulates the generated electric charge therein. The anode of the photodiode PD is grounded and the cathode thereof is coupled to the source of the transistor TG.

The gate of the transistor TG is coupled to the control line TGL, the source thereof is coupled to the cathode of the photodiode PD, and the drain thereof is coupled to the floating diffusion FD.

The floating diffusion FD is configured to accumulate electric charge transferred from the photodiode PD through the transistor TG. The floating diffusion FD includes, for example, a diffusion layer formed on a surface of a semiconductor substrate. FIG. 2 illustrates the floating diffusion FD by using a symbol of a capacitor.

The gate of the transistor RST is coupled to the control line RSTL, the drain thereof is supplied with a power supply voltage VDD, and the source thereof is coupled to the floating diffusion FD.

The gate of the transistor AMP is coupled to the floating diffusion FD, the drain thereof is supplied with the power supply voltage VDD, and the source thereof is coupled to the drain of the transistor SEL.

The gate of the transistor SEL is coupled to the control line SELL, the drain thereof is coupled to the source of the transistor AMP, and the source thereof is coupled to the signal line VSL.

This configuration electrically couples the pixel P to the signal line VSL by turning on the transistor SEL in the pixel P on the basis of a control signal SSEL supplied to the control line SELL. This couples the transistor AMP to a constant current source CS (see FIG. 3 described below) of the readout unit 20 and the transistor AMP operates as a so-called source follower. The pixel P then outputs, to the signal line VSL, the signal SIG including a voltage corresponding to the voltage at the floating diffusion FD. Specifically, as described below, the pixel P outputs a reset voltage Vreset in a P-phase period TP of two periods (the P-phase period TP and a D-phase period TD) in which the readout unit 20 performs AD conversion. The pixel P outputs the pixel voltage Vpix corresponding to the amount of received light in the D-phase period TD. The pixel P outputs the signal SIG including these reset voltage Vreset and pixel voltage Vpix to the signal line VSL.

The drive unit 12 (FIG. 1) is configured to sequentially drive the plurality of pixels P in the pixel array 11 in units of the pixel lines L on the basis of an instruction from the imaging control unit 15. Specifically, the drive unit 12 drives the plurality of pixels P in the pixel array 11 in units of the pixel lines L by suppling the plurality of respective control signals STG to the plurality of control lines TGL in the pixel array 11, suppling the plurality of respective control signals SRST to the plurality of control lines RSTL, and suppling the plurality of respective control signals SSEL to the plurality of control lines SELL.

The reference signal generation unit 13 is configured to generate a reference signal RAMP on the basis of an instruction from the imaging control unit 15. The reference signal RAMP has a so-called ramp waveform in which the voltage level is gradually changed with the lapse of time in the two periods (the P-phase period TP and the D-phase period TD) in which the readout unit 20 performs AD conversion. The reference signal generation unit 13 supplies this reference signal RAMP to the readout unit 20.

The readout unit 20 is configured to generate an image signal DATA0 on the basis of an instruction from the imaging control unit 15 by performing AD conversion on the basis of the signal SIG supplied from the pixel array 11 through the signal line VSL.

Figure 3:
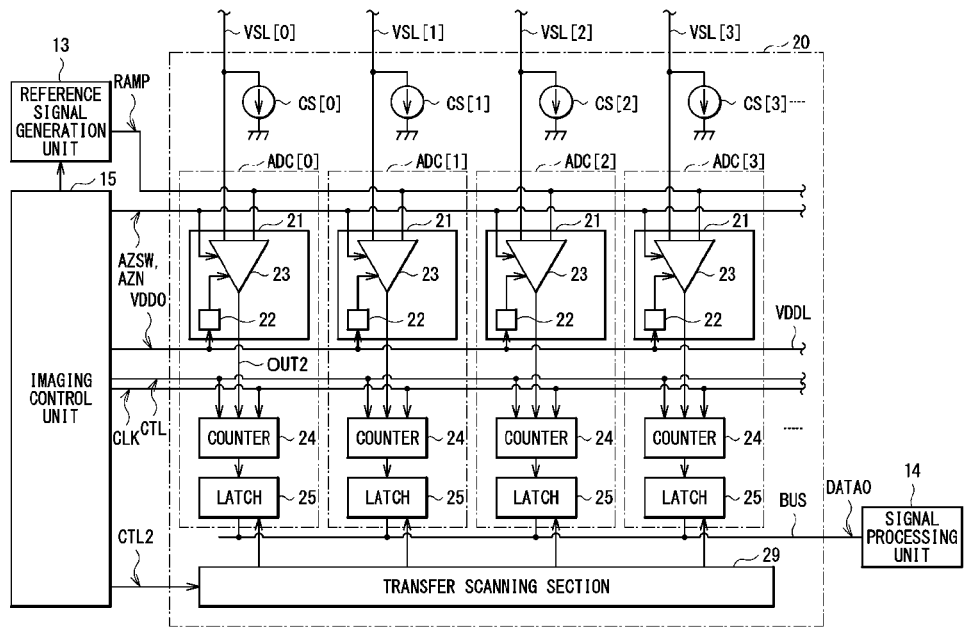
FIG. 3 is a block diagram illustrating a configuration example of a readout unit of the imaging device according to the embodiment.

FIG. 3 illustrates a configuration example of the readout unit 20 in the imaging device 1. It is to be noted that FIG. 3 also illustrates the reference signal generation unit 13, the signal processing unit 14, and the imaging control unit 15 in addition to the readout unit 20. The readout unit 20 includes the plurality of constant current sources CS (constant current sources CS[0], CS[1], CS[2], CS[2], . . . ), a plurality of AD converters ADC (AD converters ADC[0], ADC[1], ADC[2], ADC[3], . . . ), and a transfer scanning section 29.

The plurality of constant current sources CS is provided in association with the plurality of signal lines VSL. Specifically, the 0th constant current source CS[0] is provided in association with a 0th signal line VSL[0], the first constant current source CS[1] is provided in association with a first signal line VSL[1], the second constant current source CS[2] is provided in association with a second signal line VSL[2], and the third constant current source CS[3] is provided in association with a third signal line VSL[3]. The same applies to fourth and subsequent AD converters ADC. One end of each of the constant current sources CS is coupled to the corresponding signal line VSL and the other end thereof is grounded. Each of the plurality of constant current sources CS is configured to apply a predetermined current to the corresponding signal line VSL.

The plurality of AD converters ADC is provided in association with the plurality of signal lines VSL. Specifically, the 0th AD converter ADC[0] is provided in association with the 0th signal line VSL[0], the first AD converter ADC[1] is provided in association with the first signal line VSL[1], the second AD converter ADC[2] is provided in association with the second signal line VSL[2], and the third AD converter ADC[3] is provided in association with the third signal line VSL[2]. The same applies to the fourth and subsequent AD converters ADC. Each of the plurality of AD converters ADC is configured to perform AD conversion on the basis of the signal SIG supplied from the pixel array 11, thereby converting the voltage of the signal SIG into a digital code CODE. The AD converter ADC includes a comparison section 21, a counter 24, and a latch 25.

The comparison section 21 is configured to perform a comparison operation on the basis of the reference signal RAMP supplied from the reference signal generation unit 13 and the signal SIG supplied from the pixel P through the signal line VSL, thereby generating a signal OUT2. The comparison section 21 sets an operation point on the basis of control signals AZSW and AZN supplied from the imaging control unit 15 and then performs a comparison operation.

The comparison section 21 includes a power supply circuit 22 and a comparison circuit 23.

As illustrated in FIG. 3, the imaging control unit 15 supplies power supply voltages VDD0 to the plurality of comparison sections 21 through a power supply line VDDL. In each of the plurality of comparison sections 21, the power supply circuit 22 generates a power supply voltage VDD1 on the basis of this power supply voltage VDD0 and supplies the generated power supply voltage VDD1 to the comparison circuit 23. The comparison circuit 23 then performs a comparison operation on the basis of the reference signal RAMP and the signal SIG, thereby generating the signal OUT2.

The counter 24 is configured to perform a counting operation on the basis of the signal OUT2 supplied from the comparison section 21 and a control signal CTL supplied from the imaging control unit 15. In the counting operation, the pulses of a clock signal CLK supplied from the imaging control unit 15 are counted.

The latch 25 is configured to generate the digital code CODE on the basis of a count value obtained by the counter 24 and hold this digital code CODE. Specifically, the latch 25 generates the digital code CODE corresponding to a difference (CNTD−CNTP) between a count value CNTP obtained by the counter 24 in the P-phase period TP and a count value CNTD obtained by the counter 24 in the D-phase period TD. In this case, a noise reduction process by a CDS method is performed. The latch 25 then outputs this digital code CODE to a bus wiring line BUS on the basis of a control signal supplied from the transfer scanning section 29.

The transfer scanning section 29 is configured to perform control on the basis of a control signal CTL2 supplied from the imaging control unit 15 to cause the latches 25 of the plurality of AD conversion sections ADC to sequentially output the digital codes CODE to the bus wiring line BUS. The readout unit 20 sequentially transfers, to the signal processing unit 14, the plurality of digital codes CODE supplied from the plurality of AD conversion sections ADC as the image signal DATA0 by using this bus wiring line BUS.

The signal processing unit 14 (FIG. 1) is configured to perform predetermined signal processing on the image signal DATA0 to generate an image signal DATA on the basis of an instruction from the imaging control unit 15 and output this image signal DATA.

The imaging control unit 15 is configured to supply control signals to the drive unit 12, the reference signal generation unit 13, the readout unit 20, and the signal processing unit 14 and control operations of these circuits, thereby controlling an operation of the imaging device 1. Specifically, the imaging control unit 15 supplies a control signal to the drive unit 12, thereby performing control to cause the drive unit 12 to sequentially drive the plurality of pixels P in the pixel array 11 in units of the pixel lines L. In addition, the imaging control unit 15 supplies a control signal to the reference signal generation unit 13, thereby performing control to cause the reference signal generation unit 13 to generate the reference signal RAMP. In addition, the imaging control unit 15 supplies the power supply voltage VDD0 and bias voltages VB1 and VB2 to the readout unit 20 and supplies the control signals AZSW, AZN, CTL, and CTL2 and the clock signal CLK to the readout unit 20, thereby performing control to cause the readout unit 20 to generate the image signal DATA0 by performing AD conversion on the basis of the signal SIG. In addition, the imaging control unit 15 supplies a control signal to the signal processing unit 14, thereby controlling an operation of the signal processing unit 14.

(Configuration Example of Comparison Section 21)

Figure 4:
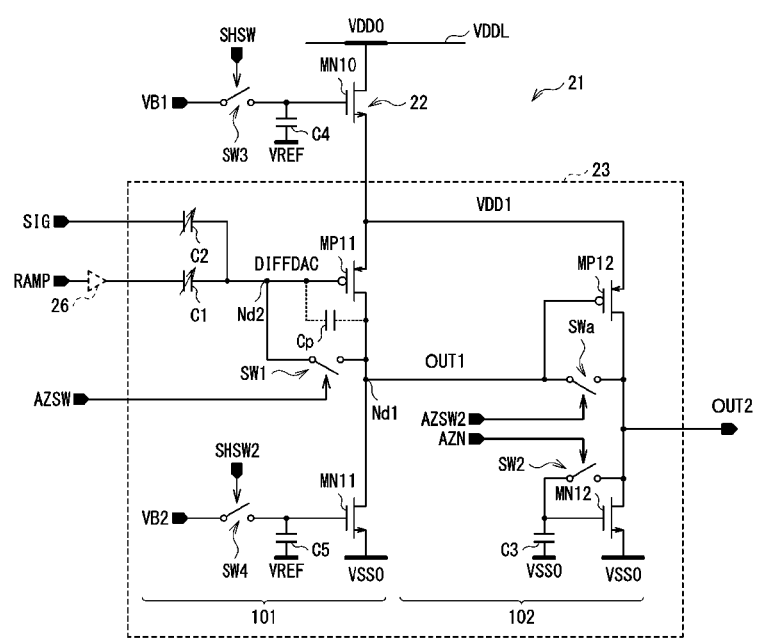
FIG. 4 is a block diagram illustrating a configuration example of a comparison section of the imaging device according to the embodiment.

FIG. 4 illustrates a configuration example of the comparison section 21. The comparison section 21 is supplied with the power supply voltage VDD0, a ground voltage VSS0, and the bias voltages VB1 and VB2. The power supply voltage VDD0 is supplied from the imaging control unit 15 through the power supply line VDDL.

The power supply circuit 22 of the comparison section 21 includes a transistor MN10, a capacitor C4, and a switch SW3.

The comparison circuit 23 of the comparison section 21 includes an initial-stage circuit 101 and a post-stage circuit 102. The initial-stage circuit 101 is configured to output a signal OUT1 corresponding to a comparison operation based on the signal SIG and the reference signal RAMP. The post-stage circuit 102 is coupled to the initial-stage circuit 101 through a connection node Nd1. The post-stage circuit 102 is configured to output the signal OUT2 corresponding to the signal OUT1 outputted from the initial-stage circuit 101 through the connection node Nd1.

The initial-stage circuit 101 includes capacitors C1, C2, and C5, transistors MP11 and MN11, and switches SW1 and SW4. The post-stage circuit 102 includes a capacitor C3, transistors MP12 and MN12, and switches SW2 and SWa.

The transistors MP11 and MP12 are P-type MOS transistors and the transistors MN10 to MN12 are N-type MOS transistors. Although not illustrated, the back gates of the transistors MP11 and MP12 are each supplied with the power supply voltage VDD0 and the back gates of the transistors MN10 to MN12 are each supplied with the ground voltage VSS0 in this example Here, the pixel signal SIG corresponds to a specific example of a "pixel signal" in the technology according to the present disclosure. The signal OUT1 corresponds to a specific example of a "first output signal" in the technology according to the present disclosure. The signal OUT2 corresponds to a specific example of a "second output signal" in the technology according to the present disclosure. The initial-stage circuit 101 corresponds to a specific example of a "first-stage amplifier circuit" in the technique of the present disclosure. The post-stage circuit 102 corresponds to a specific example of a "second-stage amplifier circuit" in the technique of the present disclosure. The switch SWa corresponds to a specific example of a "first switch" in the technology according to the present disclosure. The switch SW1 corresponds to a specific example of a "second switch" in the technology according to the present disclosure. The connection node Nd1 corresponds to a specific example of a "connection node" in the technology according to the present disclosure. The transistor MP11 corresponds to a specific example of a "first transistor" in the technology according to the present disclosure. The transistor MP12 corresponds to a specific example of a "second transistor" in the technology according to the present disclosure. The capacitor C1 corresponds to a specific example of a "first capacitor" in the technology according to the present disclosure. The capacitor C2 corresponds to a specific example of a "second capacitor" in the technology according to the present disclosure. The transistor MN11 corresponds to a specific example of a "first load transistor" in the technology according to the present disclosure. The P-phase period TP corresponds to a specific example of a "first period" in the technology according to the present disclosure. The D-phase period TD corresponds to a specific example of a "second period" in the technology according to the present disclosure.

In the power supply circuit 22, one end of the capacitor C4 is coupled to the gate of the transistor MN10 and one end of the switch SW3 and the other end thereof is supplied with a direct-current voltage VREF. This voltage VREF is generated by the imaging control unit 15. It is to be noted that the capacitor C4 may include a MOS capacitor or the like. The capacitor C4 may be configured by using, for example, the parasitic capacitance of the gate of the transistor MN10, the parasitic capacitance of the switch SW3, the parasitic capacitance of a wiring line, or the like. The switch SW3 is configured to be turned on and off on the basis of a control signal SHSW. The one end of the switch SW3 is coupled to the gate of the transistor MN10 and the one end of the capacitor C4 and the other end thereof is supplied with the bias voltage VB1. The control signal SHSW is generated by the imaging control unit 15. The capacitor C4 and the switch SW3 are included in a sample hold circuit. For example, the switch SW3 is turned on in a period in which the switches SW1 and SW2 of the comparison circuit 23 are turned on. The switch SW3 is turned off in a period in which the switches SW1 and SW2 are turned off.

The gate of the transistor MN10 is supplied with the bias voltage VB1, the drain thereof is coupled to the power supply line VDDL, and the source thereof is coupled to the sources of the transistors MP11 and MP12. The transistor MN10 operates as a so-called source follower, thereby outputting the power supply voltage VDD1 from the source.

Each of the capacitors C1 and C2 has one end and the other end. The one end of the capacitor C1 is coupled to the reference signal generation unit 13 and the other end thereof is coupled to the other end of the capacitor C2, the gate of the transistor MP11, and one end of the switch SW1. This one end of the capacitor C1 is supplied with the reference signal RAMP generated by the reference signal generation unit 13. The one end of the capacitor C2 is coupled to the signal line VSL and the other end thereof is coupled to the other end of the capacitor C1, the gate of the transistor MP11, and the one end of the switch SW1. This one end of the capacitor C2 is supplied with the signal SIG generated by the pixel P.

The gate of the transistor MP11 is coupled to the other ends of the capacitors C1 and C2 and the one end of the switch SW1 through a connection node Nd2. The signal SIG is inputted to the gate of the transistor MP11 through the capacitor C2. In addition, the reference signal RAMP is inputted to the gate of the transistor MP11 through the capacitor C1. It is to be noted that the one end of the capacitor C1 may be configured to be coupled to a buffer circuit 26. The reference signal RAMP may be inputted to the gate of the transistor MP11 through the buffer circuit 26 and the capacitor C1.

The drain of the transistor MP11 is coupled to the drain of the transistor MN11, the gate of the transistor MP12, and the other end of the switch SW1 through the connection node Nd1 and the source thereof is coupled to the sources of the transistors MN10 and MP12. In addition, the drain of the first transistor is coupled to one end of the switch SWa through the connection node Nd1.

The switch SW1 is configured to be turned on and off on the basis of the control signal AZSW. The one end of the switch SW1 is coupled to the other ends of the capacitors C1 and C2 and the gate of the transistor MP11 through the connection node Nd2 and the other end thereof is coupled to the drain of the transistor MN11 and the gate of the transistor MP12 through the connection node Nd1. In addition, the other end of the switch SW1 is coupled to the drain of the transistor MP11. In addition, the other end of the switch SW1 is coupled to the one end of the switch SWa through the connection node Nd1.

The gate of the transistor MN11 is supplied with the bias voltage VB2 through the switch SW4. The drain of the transistor MN11 is coupled to the drain of the transistor MP11, the gate of the transistor MP12, and the other end of the switch SW1 through the connection node Nd1. In addition, the drain of the transistor MN11 is coupled to the one end of the switch SWa through the connection node Nd1. The source of the transistor MN11 is supplied with the ground voltage VSS0. The transistor MN11 is a load transistor serving as a load of the transistor MP11. The transistor MN11 operates as a constant current source.

One end of the capacitor C5 is coupled to the gate of the transistor MN11 and one end of the switch SW4 and the other end thereof is supplied with the direct-current voltage VREF. This voltage VREF is generated by the imaging control unit 15. It is to be noted that the capacitor C5 may include a MOS capacitor or the like. The capacitor C5 may be configured by using, for example, the parasitic capacitance of the gate of the transistor MN11, the parasitic capacitance of the switch SW4, the parasitic capacitance of a wiring line, or the like. The switch SW4 is configured to be turned on and off on the basis of a control signal SHSW2. The one end of the switch SW4 is coupled to the gate of the transistor MN11 and the one end of the capacitor C5 and the other end thereof is supplied with the bias voltage VB2. The control signal SHSW2 is generated by the imaging control unit 15. The capacitor C5 and the switch SW4 are included in a sample hold circuit.

For example, the switch SW4 is turned on in a period in which the switches SW1 and SW2 are turned on. The switch SW4 is turned off in a period in which the switches SW1 and SW2 are turned off. This sets the voltage of the gate of the transistor MN11 to the bias voltage VB2. The switch SW4 is turned off in the P-phase period TP and D-phase period TD.

The gate of the transistor MP12 is coupled to the drains of the transistors MP11 and MN11 and the other end of the switch SW1 through the connection node Nd1, the drain thereof is coupled to the drain of the transistor MN12 and one end of the switch SW2, and the source thereof is coupled to the sources of the transistors MN10 and MP11. In addition, the drain of the transistor MP12 is coupled to the other end of the switch SWa.

The gate of the transistor MN12 is coupled to one end of the capacitor C3 and the other end of the switch SW2, the drain thereof is coupled to the drain of the transistor MP12 and the one end of the switch SW2, and the source thereof is supplied with the ground voltage VSS0. In addition, the drain of the transistor MN12 is coupled to the other end of the switch SWa.

The switch SW2 is configured to be turned on and off on the basis of the control signal AZN. The one end of the switch SW2 is coupled to the drains of the transistors MP12 and MN12 and the other end thereof is coupled to the gate of the transistor MN12 and the one end of the capacitor C3. In addition, the one end of the switch SW2 is coupled to the other end of the switch SWa.

The one end of the capacitor C3 is coupled to the gate of the transistor MN12 and the other end of the switch SW2 and the other end thereof is supplied with the ground voltage VSS0. It is to be noted that the capacitor C3 may include a MOS capacitor or the like. The capacitor C3 may be configured by using, for example, the parasitic capacitance of the gate of the transistor MN12, the parasitic capacitance of the switch SW2, the parasitic capacitance of a wiring line, or the like.

In the comparison section 21, the power supply circuit 22 generates the power supply voltage VDD1 and the comparison circuit 23 operates on the basis of this power supply voltage VDD1, thereby performing a comparison operation on the basis of the signal SIG and the reference signal RAMP. Specifically, a current generated by the transistor MN11 that operates as a constant current source flows through the transistor MN10 and the transistor MN10 operates as a so-called source follower. This causes the power supply circuit 22 to generate the power supply voltage VDD1. In the comparison circuit 23, as described below, the operation point is set by turning on the switches SW1 and SW2. The comparison circuit 23 then performs a comparison operation on the basis of the reference signal RAMP and the reset voltage Vreset included in the signal SIG in the P-phase period TP and performs a comparison operation on the basis of the reference signal RAMP and the pixel voltage Vpix included in the signal SIG in the D-phase period TD.

The switch SWa is configured to be turned on and off on the basis of a control signal AZSW2. The control signal AZSW2 is generated by the imaging control unit 15. The switch SWa has one end and another end. The one end of the switch SWa is coupled to the connection node Nd1. As described below, the switch SWa allows the impedance and the voltage at the connection node Nd1 to change. The one end of the switch SWa is coupled to the connection node Nd1 and the gate of the transistor MP12 and the other end thereof is coupled to the drain of the transistor MP12. The switch SWa is configured to allow the transistor MP12 to have a diode connection.

The switch SW1 is able to couple the gate of the transistor MP11 and the drain of the transistor MP11 by being turned on. The switch SWa causes the impedance at the connection node Nd1 to temporarily decrease by being temporarily turned on in a period including a timing (a timing to described in FIGS. 15A, 15B, 15C or 19A, 19B, 19C, 19D or another diagram described below) at which at least the switch SW1 that has been on is turned off.

The pixel P outputs the signal SIG serving as the reset voltage Vreset in the P-phase period TP as a pixel signal. After that, the pixel P outputs the signal SIG serving as the pixel voltage Vpix corresponding to the amount of received light in the D-phase period TD. The transistor MP11 has a predetermined reference voltage (AZ voltage) as the gate voltage thereof in a predetermined period (the period between the timings tp2 to tb illustrated in FIGS. 15A, 15B, 15C or 23A, 23B, 23C or another diagram described below) after the P-phase period TP ends. The transistor MP11 has a voltage lower than the predetermined reference voltage after the predetermined period ends. The switch SWa causes the voltage at the connection node Nd1 to be temporarily fixed to a predetermined fixed voltage by being turned on at a timing (the timing tp2 described below) at which the P-phase period TP ends and being turned off at a timing (the timing tb described below) at which the predetermined period ends.

Figure 5:
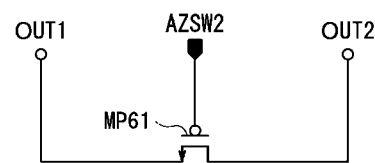
FIG. 5 is a circuit diagram illustrating a first configuration example of a switch.
Figure 6:
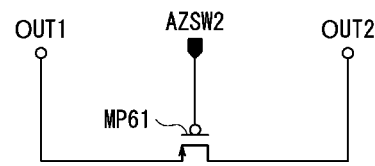
FIG. 6 is a circuit diagram illustrating a second configuration example of the switch.

FIG. 5 illustrates a first configuration example of the switch SWa. FIG. 6 illustrates a second configuration example of the switch SWa.

The switch SWa may include, for example, a MOS transistor having a gate, a drain, and a source. The switch SWa may be an NMOS switch including a transistor MN61 that is an N-type MOS transistor, for example, as illustrated in FIG. 5. In addition, the switch SWa may be a PMOS switch including a transistor MP61 that is a P-type MOS transistor, for example, as illustrated in FIG. 6.

In the respective configuration examples of FIGS. 5 and 6, the control signals AZSW2 are inputted to the gates of the respective MOS transistors. Each of the control signals AZSW2 controls the switch SWa to turn on and off the switch SWa. In addition, the source of each of the MOS transistors is coupled to the connection node Nd2 and the gate of the transistor MP12. In addition, the drain of each of the MOS transistors is coupled to the drain of the transistor MP12.

Figure 7:
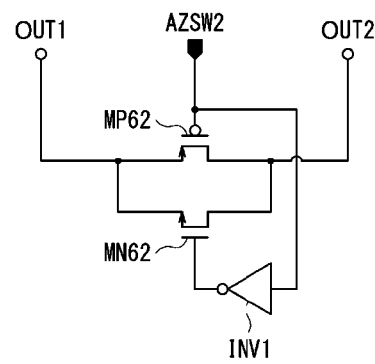
FIG. 7 is a circuit diagram illustrating a third configuration example of the switch.

FIG. 7 illustrates a third configuration example of the switch SWa.

The switch SWa may be a CMOS switch including a transistor MN62 that is an N-type MOS transistor, a transistor MP62 that is a P-type MOS transistor, and an inverter INV1, for example, as illustrated in FIG. 7.

In the configuration example of FIG. 7, the control signal AZSW2 is inputted to the gate of the transistor MP62. The control signal AZSW2 controls the switch SWa to turn on and off the switch SWa. A signal corresponding to the control signal AZSW2 is inputted to the gate of the transistor MN62 through the inverter INV1. In addition, the sources of the transistors MP62 and MN62 are coupled to the connection node Nd2 and the gate of the transistor MP12. In addition, the drains of the transistors MP62 and MN62 are coupled to the drain of the transistor MP12.

(Implementation Example of Imaging Device 1)

Next, the implementation of the imaging device 1 is described. In the imaging device 1, the respective blocks illustrated in FIG. 1 may be formed, for example, on one semiconductor substrate or a plurality of semiconductor substrates.

Figure 8:
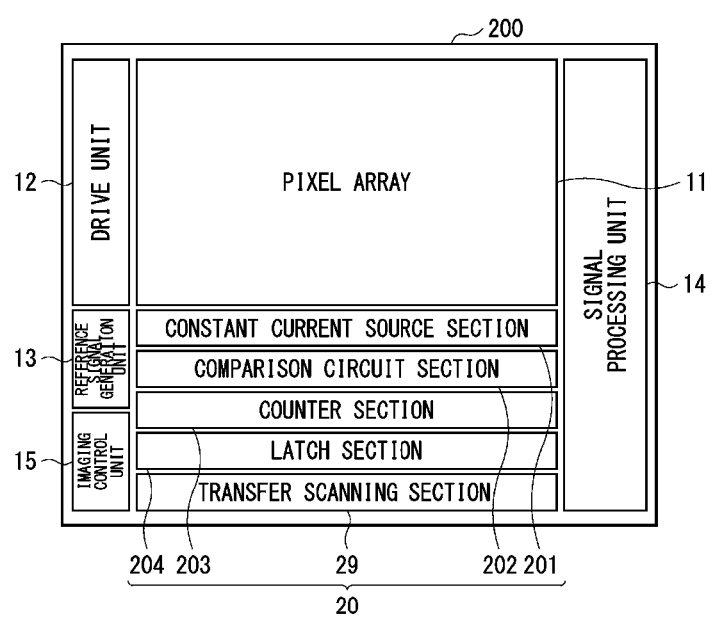
FIG. 8 is an explanatory diagram illustrating an implementation example of the imaging device according to the embodiment.

FIG. 8 illustrates an implementation example of the imaging device 1 in a case where the blocks are formed in one semiconductor substrate 200. The pixel array 11 is disposed in the semiconductor substrate 200. The drive unit 12 is disposed on the left of the pixel array 11. In addition, the readout unit 20 is disposed below the pixel array 11. In the readout unit 20, a constant current source section 201 including the plurality of constant current sources CS, a comparison circuit section 202 including the plurality of comparison sections 21, a counter section 203 including the plurality of counters 24, a latch section 204 including the plurality of latches 25, and the transfer scanning section 29 are disposed in this order from top. The reference signal generation unit 13 and the imaging control unit 15 are disposed on the left of this readout unit 20. In addition, the signal processing unit 14 is disposed on the right of the pixel array 11 and the readout unit 20.

Figure 9:
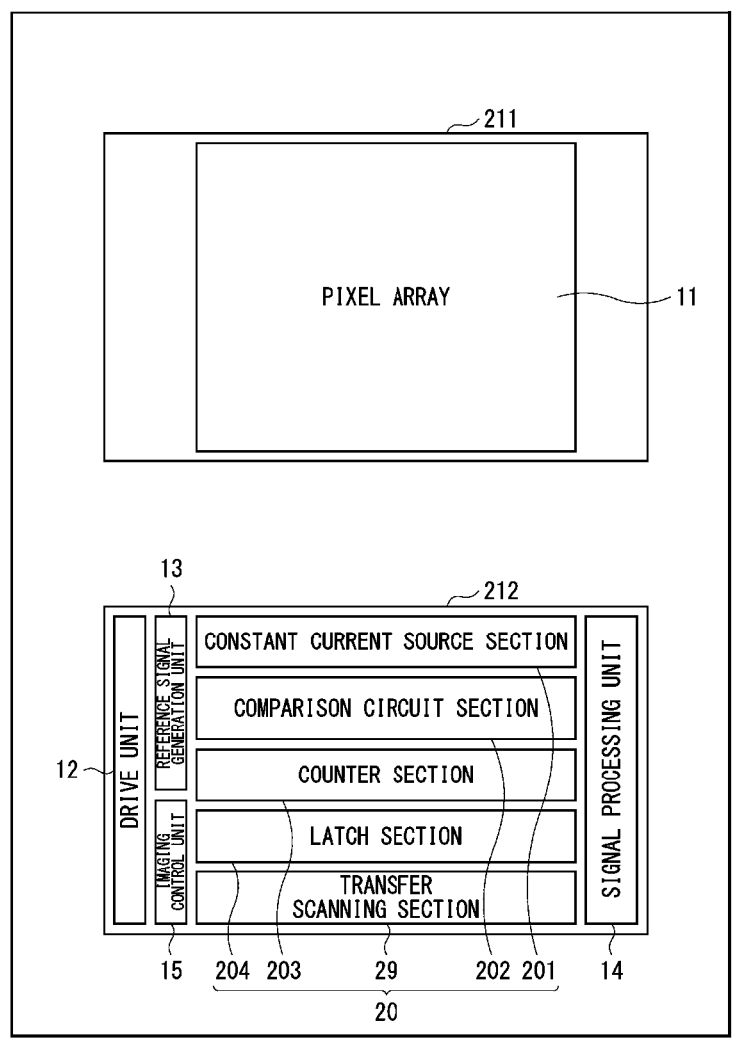
FIG. 9 is an explanatory diagram illustrating another implementation example of the imaging device according to the embodiment.

FIG. 9 illustrates an implementation example of the imaging device 1 in a case where the blocks are formed in two semiconductor substrates 211 and 212. For example, the pixel array 11 is disposed in the semiconductor substrate 211 and the readout unit 20, the drive unit 12, the reference signal generation unit 13, the signal processing unit 14, and the imaging control unit 15 are disposed in the semiconductor substrate 212. The semiconductor substrates 211 and 212 are superimposed. For example, the plurality of signal lines VSL disposed in the semiconductor substrate 211 is then electrically coupled to the readout unit 20 disposed in the semiconductor substrate 212, for example, through TSV (Through Silicon Via) and the plurality of control lines TGL, the plurality of control signals RSTL, and the plurality of control signals SELL disposed in the semiconductor substrate 211 are electrically coupled to the drive unit 12 disposed in the semiconductor substrate 212, for example, through TSV. The readout unit 20 is disposed in the semiconductor substrate 212. The drive unit 12, the reference signal generation unit 13, and the imaging control unit 15 are disposed on the left of the readout unit 20. The signal processing unit 14 is disposed on the right of the readout unit 20. In the readout unit 20, the constant current source section 201 including the plurality of constant current sources CS, the comparison circuit section 202 including the plurality of comparison sections 21, the counter section 203 including the plurality of counters 24, the latch section 204 including the plurality of latches 25, and the transfer scanning section 29 are disposed in this order from top.

In a case where the blocks are formed in the two semiconductor substrates 211 and 212 in this way (FIG. 9), disposing the pixel array 11 chiefly in the semiconductor substrate 211 makes it possible to manufacture the semiconductor substrate 211 by using a semiconductor manufacturing process specialized in the formation of pixels. That is, the semiconductor substrate 211 includes no circuit but the pixel array 11. For example, even in a case where a special manufacturing process is used to form pixels, the manufacturing process does not therefore affect circuits other than the pixel array 11. In this way, it is possible to use a semiconductor manufacturing process specialized in the formation of pixels in the imaging device 1. This makes it possible to increase the imaging characteristics of the imaging device 1.

1.2 Operation and Workings (Overview of Overall Operation)

First, an overview of the overall operation of the imaging device 1 is described with reference to FIG. 1. The drive unit 12 sequentially drives the plurality of pixels P in the pixel array 11 in units of the pixel lines L on the basis of an instruction from the imaging control unit 15. Each of the pixels P outputs the reset voltage Vreset as the signal SIG in the P-phase period TP and outputs the pixel voltage Vpix corresponding to the amount of received light as the signal SIG in the D-phase period TD.

The reference signal generation unit 13 generates the reference signal RAMP on the basis of an instruction from the imaging control unit 15. The readout unit 20 generates the image signal DATA0 on the basis of an instruction from the imaging control unit 15 by performing AD conversion on the basis of the signal SIG supplied from the pixel array 11 through the signal line VSL. The signal processing unit 14 performs predetermined signal processing on the image signal DATA0 to generate the image signal DATA on the basis of an instruction from the imaging control unit 15. The imaging control unit 15 supplies control signals to the drive unit 12, the reference signal generation unit 13, the readout unit 20, and the signal processing unit 14 and controls operations of these circuits, thereby controlling an operation of the imaging device 1.

(Detailed Operation)

In the imaging device 1, each of the plurality of pixels P accumulates electric charge corresponding to the amount of received light and outputs the pixel voltage Vpix corresponding to the amount of received light as the signal SIG. The readout unit 20 then performs AD conversion on the basis of this signal SIG.

The imaging device 1 performs exposure start driving on the pixel array 11 in the order from top in the vertical direction. Specifically, the drive unit 12 generates, for example, the control signals STG and SRST, thereby sequentially selecting the pixel lines L and sequentially turning on the transistors TG and RST in the pixels P in a time having a predetermined length. This sets the voltage of the floating diffusion FD and the voltage of the cathode of the photodiode PD to the power supply voltage VDD in each of the pixels P. In a case where the transistors TG and RST are then turned off, the photodiode PD starts to accumulate electric charge in accordance with the amount of received light. In this way, exposure periods sequentially start in the plurality of pixels P.

Next, the imaging device 1 performs readout driving on the pixel array 11 in the order from top in the vertical direction. Specifically, the drive unit 12 generates the control signals STG and SRST, thereby sequentially selecting the pixel lines L. This causes each of the pixels P to output the reset voltage Vreset as the signal SIG in the P-phase period TP and output the pixel voltage Vpix as the signal SIG in the D-phase period TD. The readout unit 20 performs AD conversion on the basis of this signal SIG, thereby generating the digital code CODE.

The imaging device 1 repeats such exposure start driving and such readout driving. This allows the imaging device 1 to obtain a series of captured images.

Next, the readout driving is described in detail. The following focuses on any of the plurality of pixels P and describes operations of the pixel P of interest and the AD converter ADC coupled to the pixel P of interest.

Figure 10:
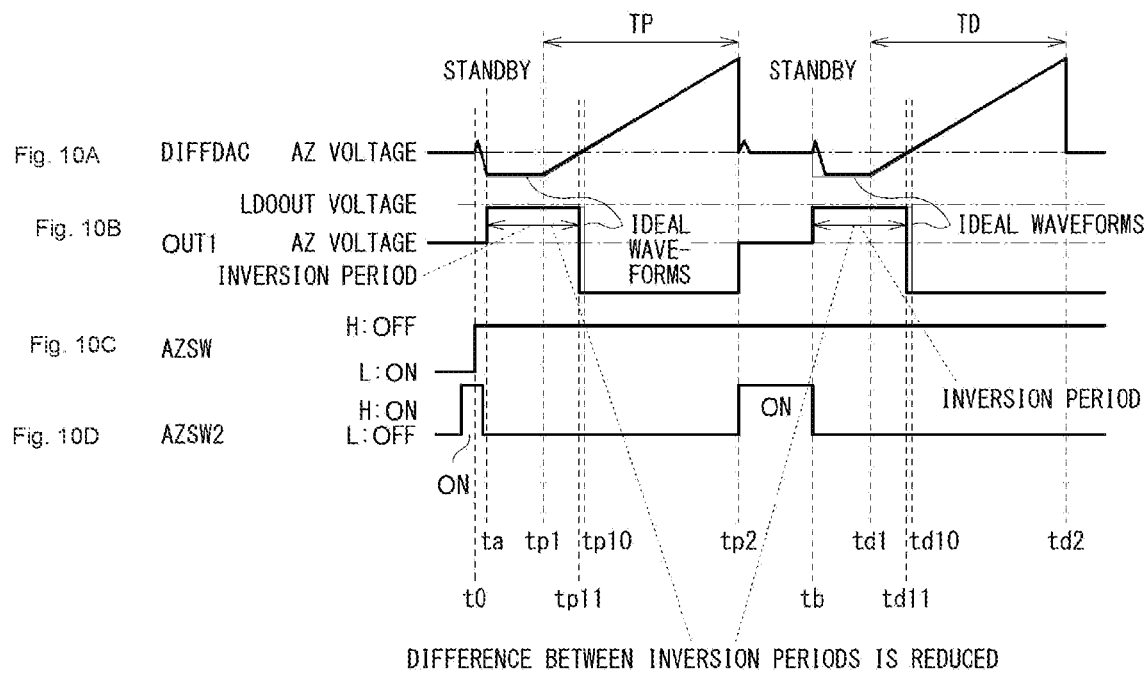
FIGS. 10A, 10B, 10C, and 10D are timing waveform charts illustrating an operation example of the comparison section in the imaging device according to the embodiment in which influence of charge injection and parasitic capacitance is taken into consideration.

FIGS. 10A, 10B, 10C, and 10D are timing waveform charts illustrating an operation example of the comparison section 21 in the imaging device 1 according to the embodiment. FIG. 10A illustrates the waveform of a voltage DIFFDAC at the connection node Nd2 in the initial-stage circuit 101. The voltage DIFFDAC corresponds to the gate voltage of the transistor MP11. FIG. 10B illustrates the voltage waveform of the signal OUT1 outputted from the initial-stage circuit 101. The voltage waveform of the signal OUT1 corresponds to the voltage waveform at the connection node Nd1. FIG. 10C illustrates the voltage waveform of the control signal AZSW that controls the switch SW1 to turn on and off the switch SW1. The voltage waveform of the control signal AZSW may be the same as the voltage waveform of the control signal AZN. FIG. 10D illustrates the voltage waveform of the control signal AZSW2 that controls the switch SWa to turn on and off the switch SWa.

It is to be noted that the voltage waveform of the signal OUT1 and the waveform of the voltage DIFFDAC are influenced in the comparison circuit 23 of the comparison section 21 by charge injection brought about in a case where the switch SW1 of the initial-stage circuit 101 that has been on is turned off as described below. In addition, as described below, the voltage waveform of the signal OUT1 and the waveform of the voltage DIFFDAC are also influenced by parasitic capacitance Cp between the gate and the drain of the transistor MP11. FIGS. 10A, 10B, 10C, and 10D illustrate waveforms obtained by taking into consideration the influence of these charge injection and parasitic capacitance Cp.

In the imaging device 1, in a certain horizontal period (H), the pixel P first outputs the reset voltage Vreset by performing a reset operation and the AD converter ADC performs AD conversion on the basis of the reset voltage Vreset in the P-phase period TP. Then, the pixel P thereafter outputs the pixel voltage Vpix by performing an electric charge transfer operation and the AD converter ADC performs AD conversion on the basis of the pixel voltage Vpix in the D-phase period TD. The following describes this operation in detail.

First, in a case where the horizontal period H starts, the drive unit 12 changes the voltage of the control signal SSEL from the low level to the high level. This turns on the transistor SEL in the pixel P and electrically couples the pixel P to the signal line VSL. In addition, the drive unit 12 changes the voltage of the control signal SRST from the low level to the high level at this timing. This turns on the transistor RST in the pixel P. The voltage of the floating diffusion FD is set to the power supply voltage VDD (reset operation). The pixel P then outputs the voltage (reset voltage Vreset) corresponding to the voltage of the floating diffusion FD in this case. In this way, the voltage of the signal SIG is set to the reset voltage Vreset.

In addition, the reference signal generation unit 13 sets the reference signal RAMP at a predetermined reference voltage at this timing. In addition, the imaging control unit 15 changes the voltages of the control signals AZSW and AZN from the high level to the low level at this timing. This turns on both the switches SW1 and SW2 in the comparison section 21 of the AD converter ADC. The switch SW1 is turned on, thereby changing the gate voltage (voltage DIFFDAC) of the transistor MP11 to the same voltage (AZ voltage (reference voltage)) as the drain voltage of the transistor MP11. The voltages of the capacitors C1 and C2 are set. In addition, the switch SW2 is turned on, thereby changing the gate voltage of the transistor MN12 to the same voltage as the drain voltage of the transistor MN12. The voltage of the capacitor C3 is set. This causes the voltages of the signal OUT1 outputted from the initial-stage circuit 101 and the signal OUT2 outputted from the post-stage circuit 102 to be the initial reference voltages. In this way, the comparison section 21 performs an operation point setting operation. This operation point setting operation is an initialization operation of the comparison section 21 and this is referred to as auto-zero operation.

Next, the drive unit 12 changes the voltage of the control signal SRST from the high level to the low level. This turns off the transistor RST in the pixel P.

Next, the imaging control unit 15 changes the voltages of the control signals AZSW and AZN from the low level to the high level at the timing to (FIG. 10C). This turns off both the switches SW1 and SW2 in the comparison section 21 of the AD converter ADC and brings the operation point setting operation (auto-zero operation) to an end. After this, the comparison section 21 operates to compare the gate voltage (voltage DIFFDAC) of the transistor MP11 and the AZ voltage (reference voltage).

In addition, the imaging control unit 15 changes the voltage of the control signal AZSW2 from the low level to the high level in a period including the timing t0 at which at least the switch SW1 that has been on is turned off (FIG. 10D). The switch SWa hereby causes the impedance at the connection node Nd1 to temporarily decrease by being temporarily turned on in a period including the timing to at which at least the switch SW1 that has been on is turned off.

Next, the reference signal generation unit 13 decreases the voltage of the reference signal RAMP at a timing ta to cause the voltage of the reference signal RAMP to be lower than a predetermined reference voltage. This causes the gate voltage (voltage DIFFDAC) of the transistor MP11 to be lower than the AZ voltage (reference voltage) in the comparison section 21 of the AD converter ADC (FIG. 10A). The signal OUT1 outputted from the initial-stage circuit 101 therefore has a LDOUT voltage higher than the AZ voltage (reference voltage) as the voltage thereof (FIG. 10B) and the voltage of the signal OUT2 outputted from the post-stage circuit 102 decreases. In other words, the comparison section 21 compares the gate voltage (voltage DIFFDAC) of the transistor MP11 and the AZ voltage (reference voltage). The gate voltage (voltage DIFFDAC) is lower than the AZ voltage (reference voltage) and the comparison section 21 thus sets the voltage of the signal OUT2 at the low level.

Next, the AD converter ADC performs AD conversion on the basis of the reset voltage Vreset in the period from timings tp1 to tp2 (P-phase period TP). Specifically, first, the reference signal generation unit 13 starts to increase the voltage of the reference signal RAMP from a voltage lower than the predetermined reference voltage at a predetermined change rate at the timing tp1. Accordingly, the gate voltage (voltage DIFFDAC) of the transistor MP11 starts to increase in the comparison section 21 of the AD converter ADC (FIG. 10A). In addition, the imaging control unit 15 starts the generation of the clock signal CLK at this timing tp1. The counter 24 of the AD converter ADC performs a counting operation, thereby counting the pulses of this clock signal CLK.

The gate voltage (voltage DIFFDAC) of the transistor MP11 then exceeds the AZ voltage (reference voltage) at a timing tp11 (ideally at a timing tp10) (FIG. 10A). That is, the gate voltage of the transistor MP11 is inverted in polarity with respect to the AZ voltage. It is to be noted that the timing tp10 is used in place of the timing tp11 in a case where the charge injection of the switch SW1 has no influence. This causes the comparison section 21 of the AD converter ADC to change the voltage of the signal OUT1 outputted from the initial-stage circuit 101 from the high level (LDOUT voltage) to the low level (FIG. 10B) and change the voltage of the signal OUT2 outputted from the post-stage circuit 102 from the low level to the high level. That is, the comparison section 21 compares the gate voltage (voltage DIFFDAC) of the transistor MP11 and the AZ voltage (reference voltage). The gate voltage (voltage DIFFDAC) exceeds the AZ voltage (reference voltage). That is, the gate voltage (voltage DIFFDAC) is inverted in polarity with respect to the AZ voltage (reference voltage). The comparison section 21 therefore changes the voltage of the signal OUT2 from the low level to the high level. The counter 24 of the AD converter ADC stops the counting operation on the basis of the transition of this signal OUT2. In this case, the count value of the counter 24 is CNTP. The latch 25 of the AD converter ADC latches this count value CNTP as a count value in the P-phase period TP. The counter 24 is then reset.

Next, at the timing tp2, the reference signal generation unit 13 sets the voltage of the reference signal RAMP to a predetermined reference voltage in response to the end of the P-phase period TP. In addition, the imaging control unit 15 stops the generation of the clock signal CLK at this timing tp2.

Next, the reference signal generation unit 13 decreases the voltage of the reference signal RAMP at the timing tb to cause the voltage of the reference signal RAMP to be lower than a predetermined reference voltage. This causes the gate voltage (voltage DIFFDAC) of the transistor MP11 to be lower than the AZ voltage (reference voltage) in the comparison section 21 of the AD converter ADC (FIG. 10A). The signal OUT1 outputted from the initial-stage circuit 101 therefore has a LDOUT voltage higher than the AZ voltage (reference voltage) as the voltage thereof (FIG. 10B) and the voltage of the signal OUT2 outputted from the post-stage circuit 102 decreases. In other words, the comparison section 21 compares the gate voltage (voltage DIFFDAC) of the transistor MP11 and the AZ voltage (reference voltage). The gate voltage (voltage DIFFDAC) is lower than the AZ voltage (reference voltage) and the comparison section 21 thus sets the voltage of the signal OUT2 at the low level.

In this way, the transistor MP11 has a predetermined reference voltage (AZ voltage) as the gate voltage (voltage DIFFDAC) in a predetermined period (the period between the timings tp2 to tb) after the P-phase period TP ends. The transistor MP11 has a voltage lower than the predetermined reference voltage after the predetermined period ends. The switch SWa causes the voltage at the connection node Nd1 to be temporarily fixed to a predetermined fixed voltage by being turned on at the timing tp2 at which the P-phase period TP ends and being turned off at the timing tb at which the predetermined period ends (FIGS. 10B and 10D).

Next, the AD converter ADC performs AD conversion on the basis of the pixel voltage Vpix in the period from timings td1 to td2 (D-phase period TD). Specifically, first, the reference signal generation unit 13 starts to increase the voltage of the reference signal RAMP from a voltage lower than the predetermined reference voltage at a predetermined change rate at the timing td1. Accordingly, the gate voltage (voltage DIFFDAC) of the transistor MP11 starts to increase in the comparison section 21 of the AD converter ADC (FIG. 10A). In addition, the imaging control unit 15 starts the generation of the clock signal CLK at this timing td1. The counter 24 of the AD converter ADC performs a counting operation, thereby counting the pulses of this clock signal CLK.

Next, the gate voltage (voltage DIFFDAC) of the transistor MP11 exceeds the AZ voltage (reference voltage) at a timing td11 (ideally at a timing td10) (FIG. 10A). That is, the gate voltage of the transistor MP11 is inverted in polarity with respect to the AZ voltage. It is to be noted that the timing td10 is used in place of the timing td11 in a case where the parasitic capacitance Cp has no influence. This causes the comparison section 21 of the AD converter ADC to change the voltage of the signal OUT1 outputted from the initial-stage circuit 101 from the high level (LDOUT voltage) to the low level (FIG. 10B) and change the voltage of the signal OUT2 outputted from the post-stage circuit 102 from the low level to the high level. That is, the comparison section 21 compares the gate voltage (voltage DIFFDAC) of the transistor MP11 and the AZ voltage (reference voltage). The gate voltage (voltage DIFFDAC) exceeds the AZ voltage (reference voltage) and the comparison section 21 thus changes the voltage of the signal OUT2 from the low level to the high level. The counter 24 of the AD converter ADC stops the counting operation on the basis of the transition of this signal OUT2. In this case, the count value of the counter 24 is CNTD. The latch 25 of the AD converter ADC latches this count value CNTD as a count value in the D-phase period TD. The counter 24 is then reset.

Next, at the timing td2, the reference signal generation unit 13 sets the voltage of the reference signal RAMP to a predetermined reference voltage in response to the end of the D-phase period TD. In addition, the imaging control unit 15 stops the generation of the clock signal CLK at this timing td2. The drive unit 12 then changes the voltage of the control signal SSEL from the high level to the low level at this timing td2. This turns off the transistor SEL in the pixel P and electrically uncouples the pixel P from the signal line VSL.

The latch 25 of the AD converter ADC then generates the digital code CODE corresponding to a difference (CNTD−CNTP) between the count value CNTP obtained by the counter 24 in the P-phase period TP and the count value CNTD obtained by the counter 24 in the D-phase period TD.

(Description of CDS Error)

Figure 11:
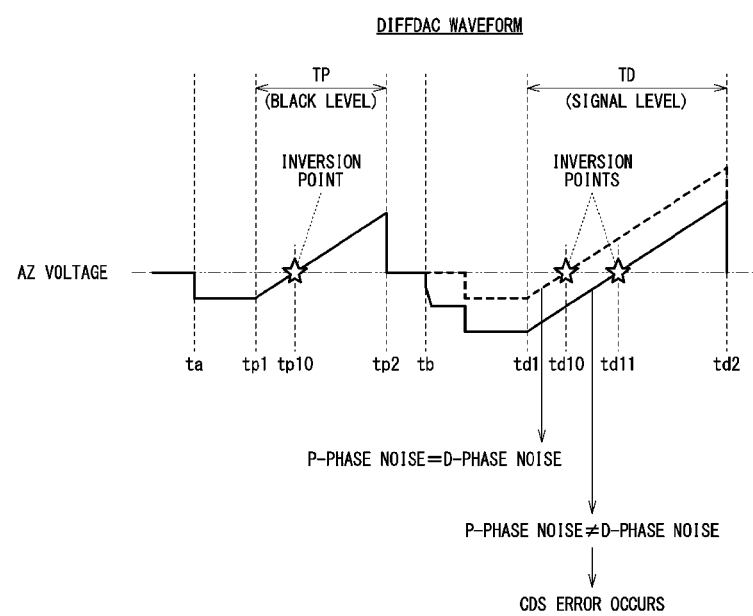
FIG. 11 is a timing waveform chart illustrating an operation example of the comparison section in the imaging device according to the embodiment.
Figure 12:
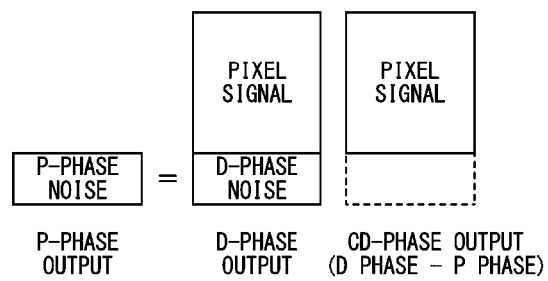
FIG. 12 is an explanatory diagram schematically illustrating an output signal subjected to a noise reduction process by a CDS method in absence of a CDS error.
Figure 13:
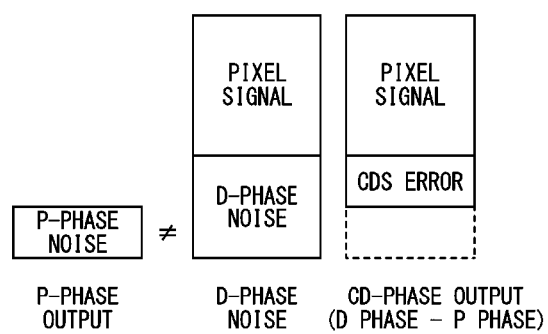
FIG. 13 is an explanatory diagram schematically illustrating the output signal subjected to the noise reduction process by the CDS method in a case where a CDS error occurs.

FIG. 11 is a timing waveform chart illustrating an operation example of the comparison section 21 in the imaging device 1 according to the embodiment. FIG. 11 illustrates the waveform of the voltage DIFFDAC at the connection node Nd2. It is to be noted that FIG. 11 illustrates a simpler waveform than the timing waveform illustrated in FIG. 10A for simplicity of description. The voltage DIFFDAC corresponds to the gate voltage of the transistor MP11. FIG. 12 schematically illustrates an output signal subjected to a noise reduction process by a CDS method in the absence of a CDS error. FIG. 13 schematically illustrates an output signal subjected to a noise reduction process by a CDS method in a case where a CDS error occurs As described above, in the imaging device 1, a counting operation is performed on the basis of the reset voltage Vreset (black level) in the P-phase period TP to acquire the count value CNTP. A counting operation is performed on the basis of the pixel voltage Vpix (signal level) in the D-phase period TD to acquire a count value CNTD. Then, in the imaging device 1, the digital code CODE corresponding to the difference (CNTD−CNTP) between the count values CNTP and CNTD is generated. The imaging device 1 performs a noise reduction process by such a CDS method. This ideally makes it possible to remove the noise component included in the pixel voltage Vpix. As a result, it is possible to increase the image quality of a captured image.

In a case where noise (P-phase noise) in the P-phase period TP and noise (D-phase noise) in the D-phase period TD are the same, an ideal pixel signal from which the noise is removed is obtained as an output signal (CDS output) subjected to a noise reduction process by a CDS method as illustrated in FIG. 12. In contrast, in a case where noise (P-phase noise) in the P-phase period TP and noise (D-phase noise) in the D-phase period TD are different, a CDS error occurs and a pixel signal having noise left therein is obtained as an output signal (CDS output) subjected to a noise reduction process by a CDS method as illustrated in FIG. 13.

Here, the count value in the P-phase period TP is a count value from the timing tp1 to the voltage DIFFDAC exceeding the AZ voltage (reference voltage) as illustrated in FIG. 11. In other words, the count value in the P-phase period TP is a count value from the timing tp1 to an inversion point (timing tp10) at which the gate voltage of the transistor MP11 is inverted in polarity with respect to the AZ voltage. In this, the count value in the D-phase period TD is a count value from the timing td1 to the voltage DIFFDAC exceeding the AZ voltage (reference voltage). In other words, the count value in the D-phase period TD is a count value from the timing td1 to an inversion point (timing td10 or td11) at which the gate voltage of the transistor MP11 is inverted in polarity with respect to the AZ voltage. This causes a difference between the count period (inversion period) in the P-phase period TP and the count period (inversion period) in the D-phase period TD and brings about a CDS error, for example, in a case where the D-phase period TD has an inversion point at the timing td11 instead of the ideal timing td10.

(Influence of Charge Injection and Parasitic Capacitance Cp)

Next, the influence of charge injection is described that is brought about in a case where the switch SW1 of the initial-stage circuit 101 that has been on is turned off in the comparison circuit 23 of the comparison section 21. In addition, the influence of the parasitic capacitance Cp between the gate and the drain of the transistor MP11 is described.

As described below, the comparison circuit 23 according to the embodiment is provided with the switch SWa. The comparison circuit 23 according to the embodiment reduces the influence of these charge injection and parasitic capacitance Cp by turning on the switch SWa at an appropriate timing. This reduces the difference between the inversion period in the P-phase period TP and the inversion period in the D-phase period TD and reduces the occurrence of a CDS error (FIG. 10B).

Figure 14:
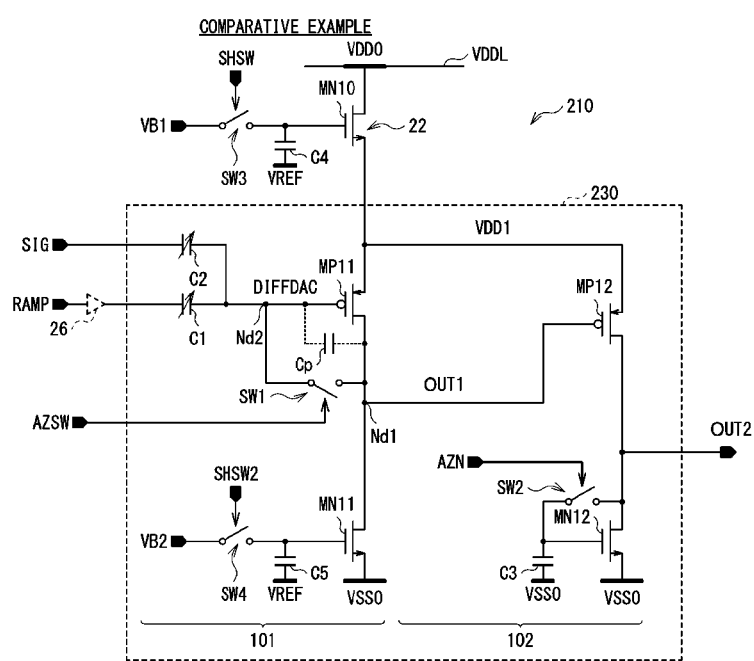
FIG. 14 is a block diagram illustrating a configuration example of a comparison section according to a comparative example.

FIG. 14 illustrates a configuration example of a comparison section 210 according to a comparative example.

The comparison section 210 according to the comparative example includes a comparison circuit 230 having a configuration in which the switch SWa is omitted from the components of the comparison section 21 illustrated in FIG. 4. The other components are similar to those of the comparison section 21 illustrated in FIG. 4.

Figure 15:
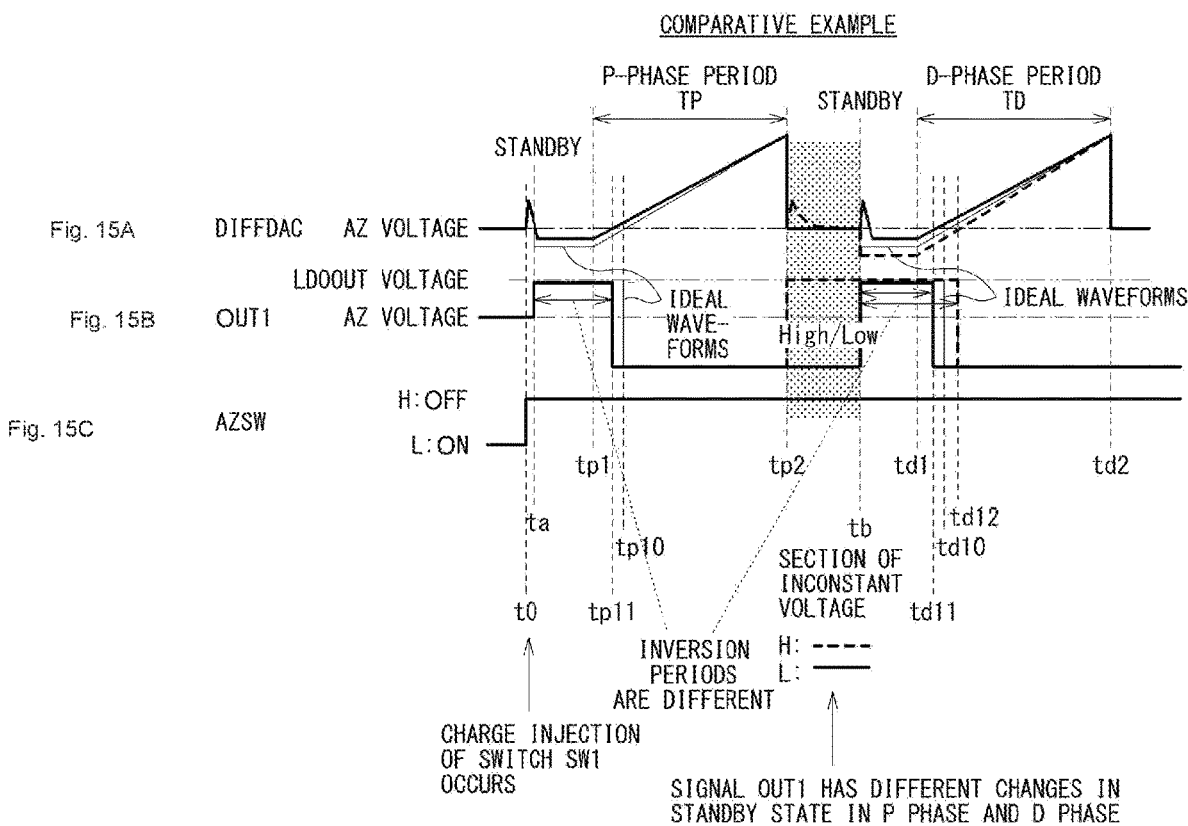
FIGS. 15A, 15B, and 15C are timing waveform charts illustrating an operation example of the comparison section according to the comparative example in which the influence of the charge injection and the parasitic capacitance is taken into consideration.

FIGS. 15A, 15B, and 15C are timing waveform charts illustrating an operation example of the comparison section 210 according to the comparative example in which the influence of the charge injection and the parasitic capacitance Cp is taken into consideration. FIG. 15A illustrates the waveform of the voltage DIFFDAC at the connection node Nd2 in the initial-stage circuit 101 in the comparison section 210. The voltage DIFFDAC corresponds to the gate voltage of the transistor MP11. FIG. 15B illustrates the voltage waveform of the signal OUT1 outputted from the initial-stage circuit 101. The voltage waveform of the signal OUT1 corresponds to the voltage waveform at the connection node Nd1. FIG. 15C illustrates the voltage waveform of the control signal AZSW that controls the switch SW1 to turn on and off the switch SW1.

The comparison circuit 230 according to the comparative example has charge injection at the timing t0 at which the switch SW1 that has been on is turned off.

In addition, in the comparison circuit 230 according to the comparative example, the signal OUT1 has an inconstant voltage in a predetermined period (the period between the timings tp2 to tb) after the P-phase period TP ends. The voltage of the signal OUT1 is at any of the low level (L) or the high level (H). This increases the difference between the inversion period in the P-phase period TP and the inversion period in the D-phase period TD in the comparison circuit 230 according to the comparative example as compared with the comparison circuit 23 according to the embodiment.

The following separately describes the influence of charge injection and the influence of the parasitic capacitance Cp to facilitate understanding.

(Influence of Charge Injection)

Figure 16:
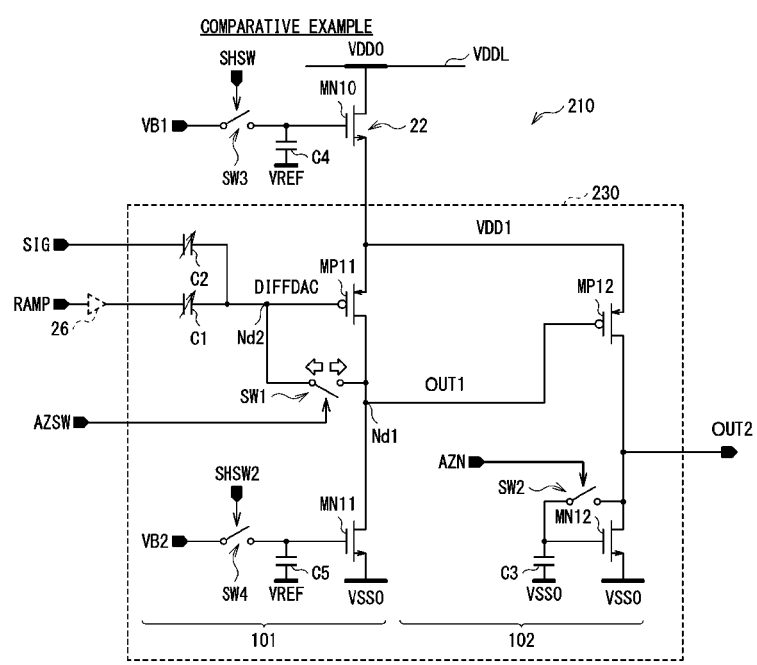
FIG. 16 is a block diagram illustrating a configuration example of the comparison section according to the comparative example in which influence of charge injection is taken into consideration.
Figure 17:
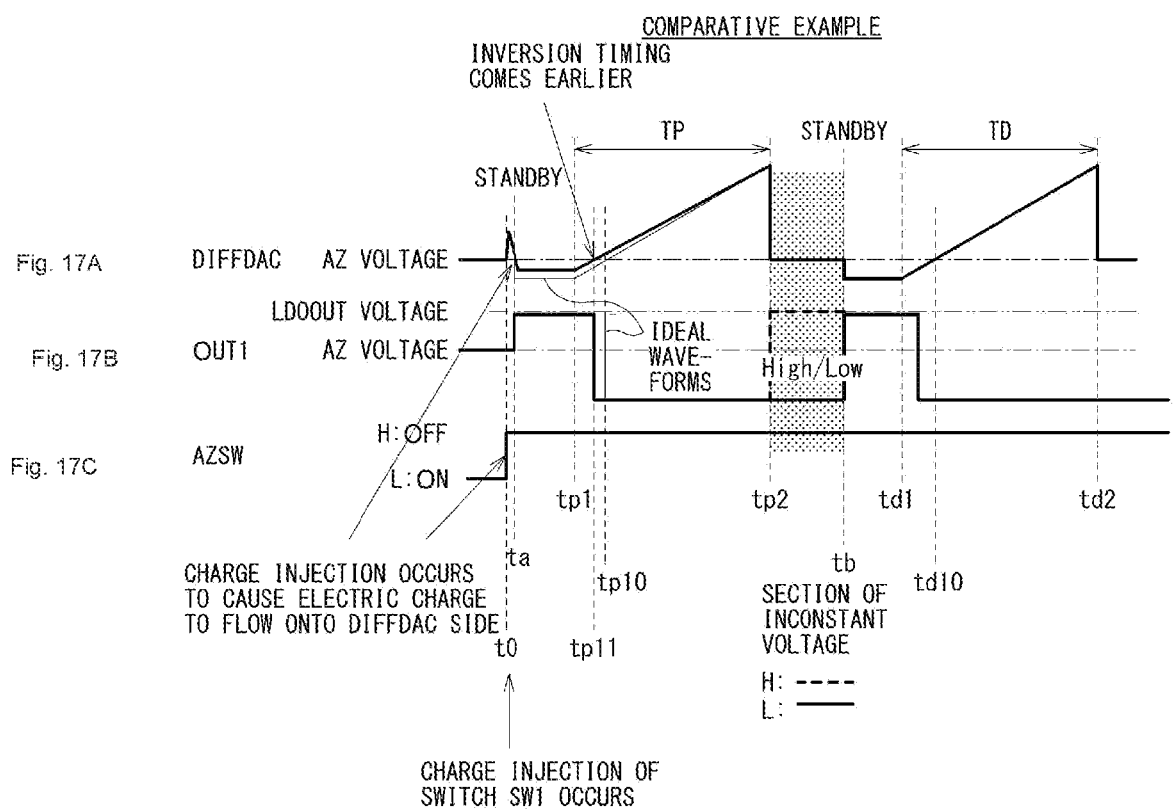
FIGS. 17A, 17B, and 17C are timing waveform charts illustrating an operation example of the comparison section according to the comparative example in which the charge injection is taken into consideration.
Figure 18:
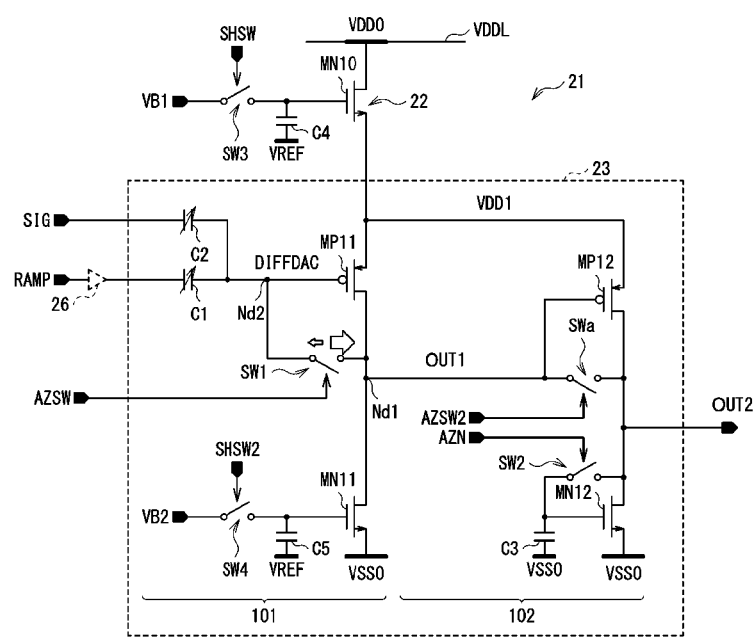
FIG. 18 is a block diagram illustrating a configuration example of the comparison section in the imaging device according to the embodiment in which the influence of the charge injection is taken into consideration.

FIG. 16 illustrates a configuration example of the comparison section 210 according to the comparative example in which the influence of the charge injection is taken into consideration. FIGS. 17A, 17B, and 17C are timing waveform charts illustrating an operation example of the comparison section 210 according to the comparative example in which the charge injection is taken into consideration. FIG. 18 illustrates a configuration example of the comparison section 21 according to the embodiment in which the influence of the charge injection is taken into consideration. FIGS. 19A, 19B, 19C, and 19D are timing waveform charts illustrating an operation example of the comparison section 21 according to the embodiment in which the influence of the charge injection is taken into consideration.

Figure 19:
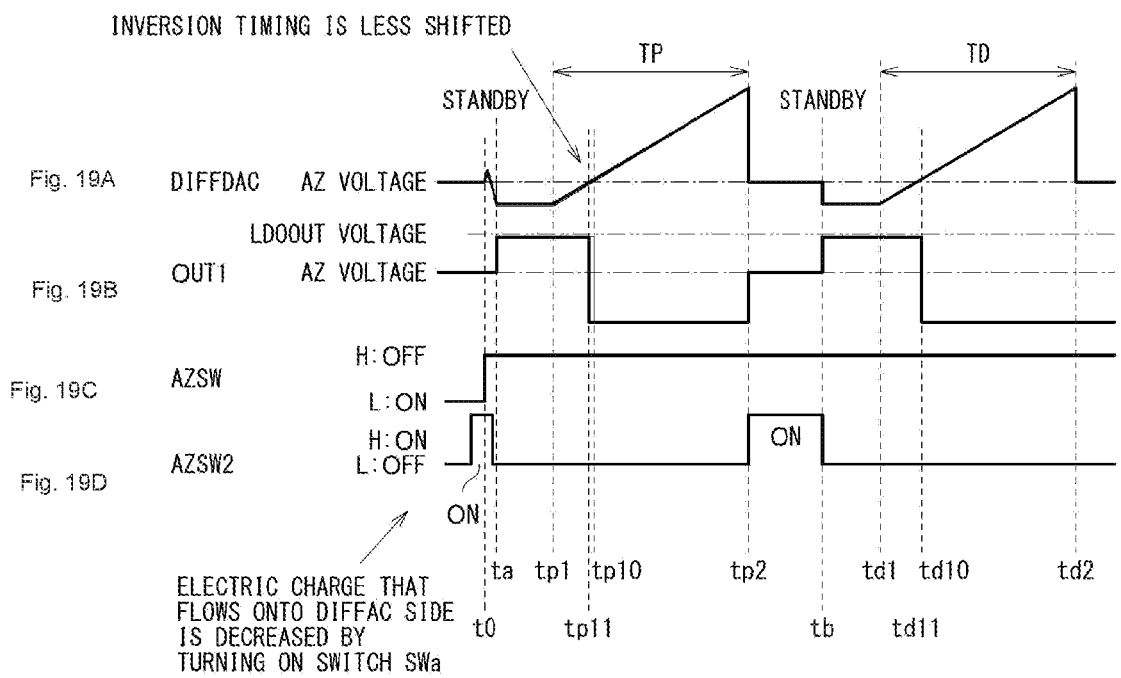
FIGS. 19A, 19B, 19C, and 19D are timing waveform charts illustrating an operation example of the comparison section in the imaging device according to the embodiment in which influence of charge injection is taken into consideration.

FIGS. 17A and 19A illustrate the waveforms of the voltage DIFFDAC at the connection node Nd2 in the initial-stage circuit 101. The voltage DIFFDAC corresponds to the gate voltage of the transistor MP11. FIGS. 17B and 19B illustrate the voltage waveforms of the signal OUT1 outputted from the initial-stage circuit 101. The voltage waveform of the signal OUT1 corresponds to the voltage waveform at the connection node Nd1. FIGS. 17C and 19C illustrate the voltage waveforms of the control signal AZSW that controls the switch SW1 to turn on and off the switch SW1. The voltage waveform of the control signal AZSW may be the same as the voltage waveform of the control signal AZN. FIG. 19D illustrates the voltage waveform of the control signal AZSW2 that controls the switch SWa to turn on and off the switch SWa.

As illustrated in FIGS. 16, 17A, 17B, and 17C, the impedance at the connection node Nd1 is high impedance in the comparison circuit 230 according to the comparative example. The charge injection of the switch SW1 therefore occurs at the timing to at which the switch SW1 that has been on is turned off. This facilitates electric charge to flow onto the connection node Nd2 side. This influences the gate voltage (voltage DIFFDAC) of the transistor MP11. The voltage DIFFDAC has an inversion timing in the P-phase period TP at the timing tp11, which is earlier than the original ideal timing tp10. This shifts the inversion period in the P-phase period TP from the ideal inversion period in the comparison circuit 230 according to the comparative example, causing a CDS error.

In contrast, in the comparison circuit 23 according to the embodiment, the switch SWa is temporarily turned on and the impedance at the connection node Nd1 temporarily decreases in the period including the timing to at which the switch SW1 that has been on is turned off as illustrated in FIGS. 18, 19A, 19B, 19C, and 19D. This facilitates electric charge to flow onto the connection node Nd1 side and causes less electric charge to flow onto the connection node Nd2 side as compared with the comparison circuit 230 according to the comparative example. As a result, the inversion timing of the voltage DIFFDAC in the P-phase period TP comes closer to the original ideal timing tp10 and the inversion period in the P-phase period TP comes closer to the ideal inversion period, reducing the CDS error as compared with the comparison circuit 230 according to the comparative example.

(Influence of Parasitic Capacitance Cp)

Figure 20:
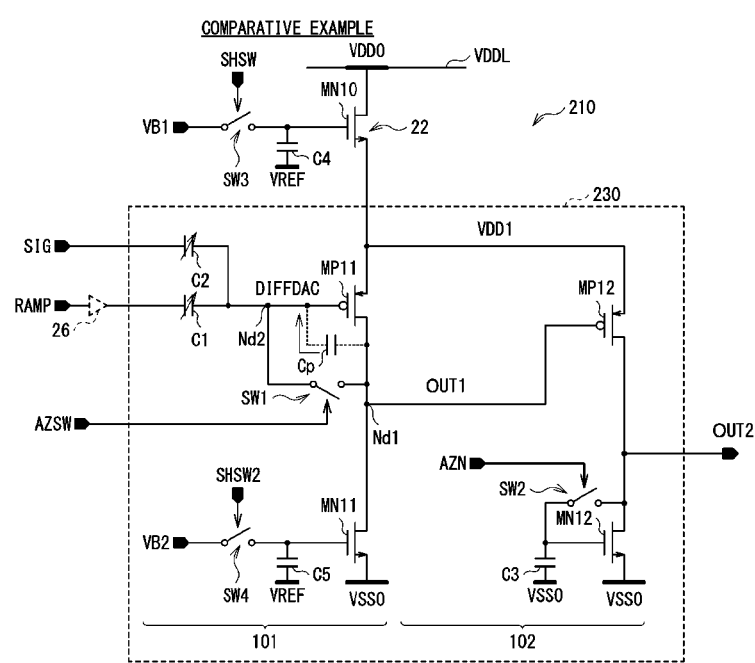
FIG. 20 is a block diagram illustrating a configuration example of the comparison section according to the comparative example in which the influence of the parasitic capacitance is taken into consideration.
Figure 21:
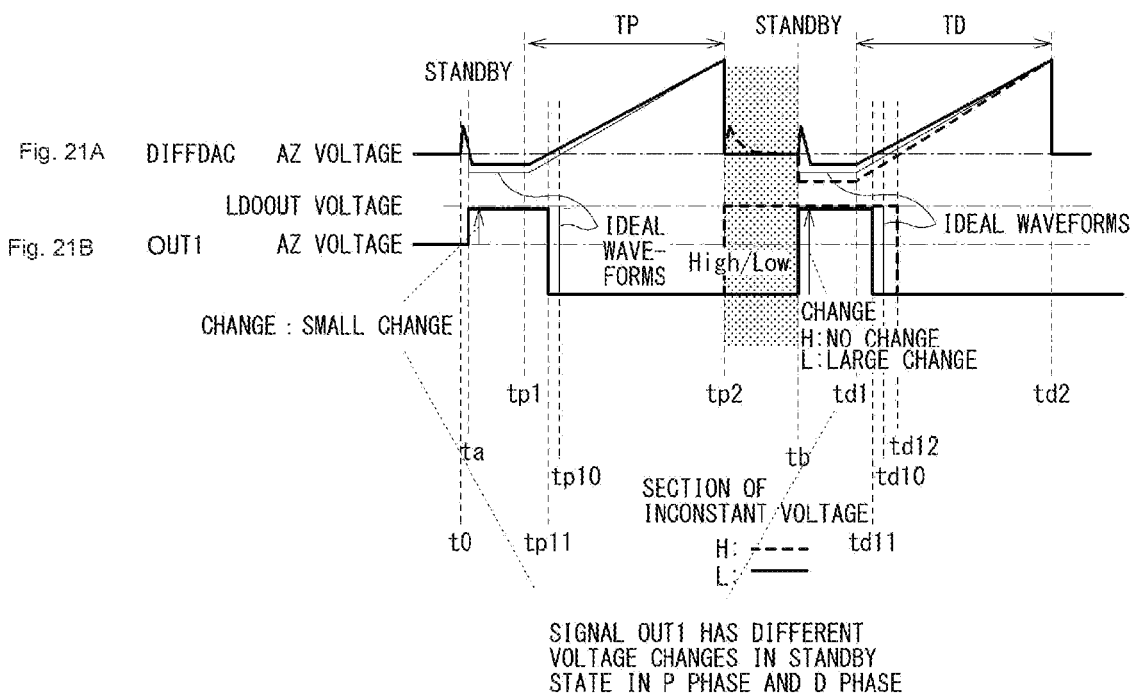
FIGS. 21A and 21B is a are timing waveform charts illustrating an operation example of the comparison section according to the comparative example in which the influence of the parasitic capacitance is taken into consideration.
Figure 22:
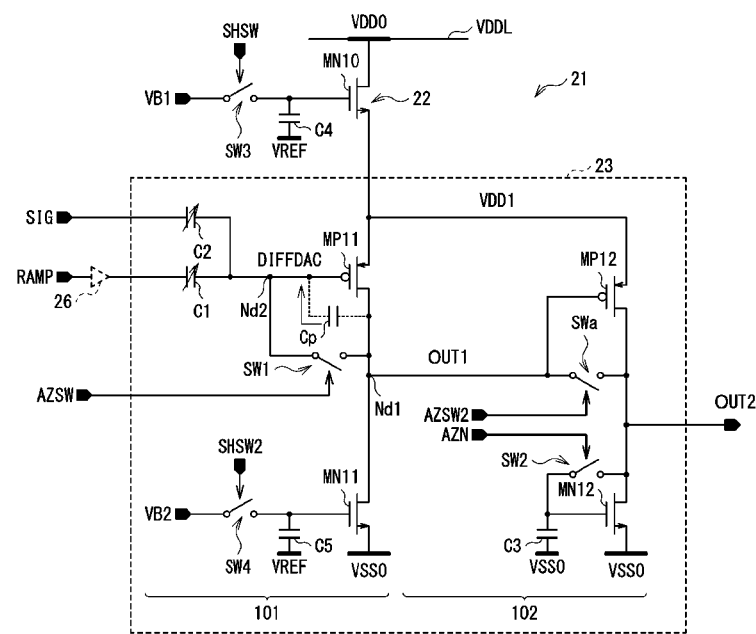
FIG. 22 is a block diagram illustrating a configuration example of the comparison section in the imaging device according to the embodiment in which the influence of the parasitic capacitance is taken into consideration.
Figure 23:
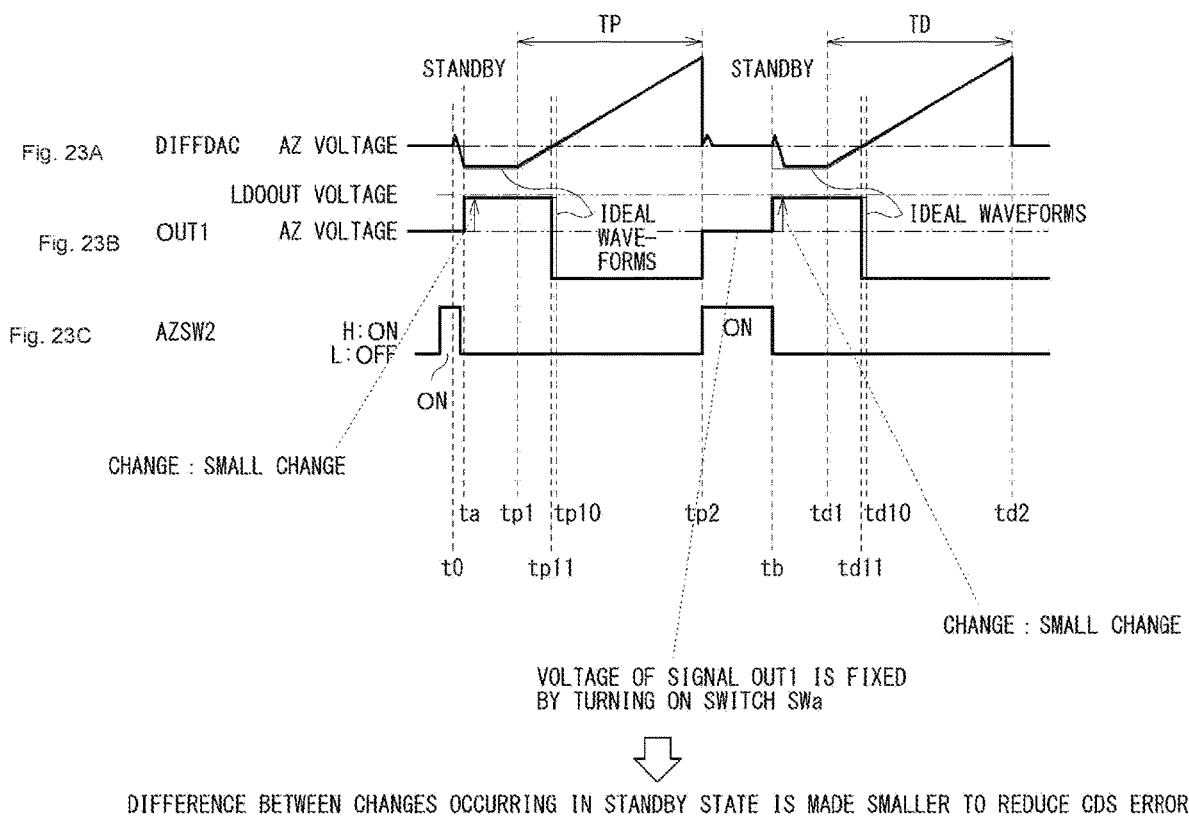
FIGS. 23A, 23B, and 23C are timing waveform charts illustrating an operation example of the comparison section in the imaging device according to the embodiment in which the influence of the parasitic capacitance is taken into consideration.

FIG. 20 illustrates a configuration example of the comparison section 210 according to the comparative example in which the influence of the parasitic capacitance Cp is taken into consideration. FIGS. 21A and 21B are timing waveform charts illustrating an operation example of the comparison section 210 according to the comparative example in which the influence of the parasitic capacitance Cp is taken into consideration. FIG. 22 illustrates a configuration example of the comparison section 21 according to the embodiment in which the influence of the parasitic capacitance Cp is taken into consideration. FIGS. 23A, 23B, and 23C are timing waveform charts illustrating an operation example of the comparison section 21 according to the embodiment in which the influence of the parasitic capacitance Cp is taken into consideration.

FIGS. 21A and 23A illustrate the waveforms of the voltage DIFFDAC at the connection node Nd2 in the initial-stage circuit 101. The voltage DIFFDAC corresponds to the gate voltage of the transistor MP11. FIGS. 21B and 23B illustrate the voltage waveforms of the signal OUT1 outputted from the initial-stage circuit 101. FIG. 23C illustrates the voltage waveform of the control signal AZSW2 that controls the switch SWa to turn on and off the switch SWa.

As illustrated in FIGS. 20, 21A, and 21B, in the comparison circuit 230 according to the comparative example, a voltage change in the signal OUT1 interferes with the voltage DIFFDAC at the connection node Nd2 through the parasitic capacitance Cp. In the comparison circuit 230 according to the comparative example, the signal OUT1 has a small voltage change in a standby state (timing ta) in the P-phase period TP. In contrast, the signal OUT1 in the standby state (timing tb) in the D-phase period TD has an inconstant voltage. In a case of the low level (L), the signal OUT1 has a large voltage change. In a case of the high level (H), the signal OUT1 has no voltage change. This causes a difference between the voltage change in the signal OUT1 in the standby state in the P-phase period TP and the voltage change in the signal OUT1 in the standby state in the D-phase period TD. This causes a difference between the inversion period in the P-phase period TP and the inversion period in the D-phase period TD in the comparison circuit 230 according to the comparative example, causing a CDS error.

As illustrated in FIGS. 22, 23A, 23B, and 23C, in the comparison circuit 23 according to the embodiment, a voltage change in the signal OUT1 also interferes with the voltage DIFFDAC at the connection node Nd2 through the parasitic capacitance Cp. The comparison circuit 23 according to the embodiment, however, causes the voltage at the connection node Nd1 to be temporarily fixed to a predetermined fixed voltage and brings the voltage at the connection node Nd1 closer to the AZ voltage by turning on the switch SWa at the timing tp2 at which the P-phase period TP ends and turning off the switch SWa at the timing tb at which a predetermined period (the period between the timings tp2 to tb) ends. This decreases the voltage change in the signal OUT1 in the standby state (timing tb) in the D-phase period TD. This decreases the difference between the inversion period in the P-phase period TP and the inversion period in the D-phase period TD in the comparison circuit 23 according to the embodiment and reduces the CDS error as compared with the comparison circuit 230 according to the comparative example.

1.3 Effects

As described above, in the imaging device 1 according to the embodiment, the one end of the switch SWa is coupled to the connection node Nd1 between the initial-stage circuit 101 and the post-stage circuit 102 to allow the impedance and the voltage at the connection node Nd1 to change. This makes it possible to accurately perform a noise reduction process.

It is to be noted that the effects described in this specification are merely illustrative, but not limitative. In addition, there may be any other effects. The same applies to the effects of the following modification examples and other embodiments.

1.4 Modification Examples

Modification Example 1

Figure 24:
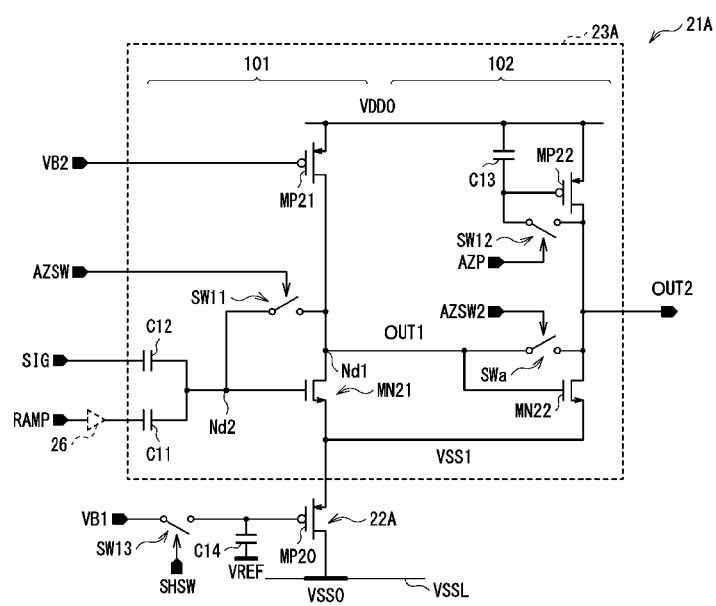
FIG. 24 is a circuit diagram schematically illustrating a configuration example of a comparison section according to a modification example 1.

FIG. 24 schematically illustrates a configuration example of a comparison section 21A according to a modification example 1.

The comparison section 21 is not limited to the configuration illustrated in FIG. 4, but may be configured as with the comparison section 21A according to the modification example 1 illustrated in FIG. 24. In the comparison section 21A according to the modification example 1, the ground voltage VSS0 is supplied from the imaging control unit 15 through a ground line VSSL. This comparison section 21A includes a power supply circuit 22A and a comparison circuit 23A. The power supply circuit 22A includes a transistor MP20, a capacitor C14, and a switch SW13. The comparison circuit 23A includes capacitors C11 and C12, transistors MN21, MP21, MN22, and MP22, switches SW11, SW12, and SWa, and a capacitor C13. The transistors MP20 to MP22 are P-type MOS transistors and the transistors MN21 and MN22 are N-type MOS transistors.

In the power supply circuit 22A, one end of the capacitor C14 is coupled to the gate of the transistor MP20 and one end of the switch SW13 and the other end thereof is supplied with the direct-current voltage VREF. This voltage VREF is generated by the imaging control unit 15. It is to be noted that the capacitor C14 may include a MOS capacitor or the like. The capacitor C14 may be configured by using, for example, the parasitic capacitance of the gate of the transistor MP20, the parasitic capacitance of the switch SW13, the parasitic capacitance of a wiring line, or the like. The switch SW13 is configured to be turned on and off on the basis of the control signal SHSW. The one end of the switch SW13 is coupled to the gate of the transistor MP20 and the one end of the capacitor C14 and the other end thereof is supplied with the bias voltage VB1. The control signal SHSW is generated by the imaging control unit 15. The capacitor C14 and the switch SW13 are included in a sample hold circuit. For example, the switch SW13 is turned on in a period in which the switches SW11 and SW12 of the comparison circuit 23A are turned on. The switch SW13 is turned off in a period in which the switches SW11 and SW12 are turned off.

The gate of the transistor MP20 is supplied with the bias voltage VB1, the drain thereof is coupled to the ground line VSSL, and the source thereof is coupled to the sources of the transistors MN21 and MN22. The transistor MP20 operates as a so-called source follower, thereby outputting a ground voltage VSS1 from the source.

Each of the capacitors C11 and C12 has one end and the other end. The one end of the capacitor C11 is coupled to the reference signal generation unit 13 and the other end thereof is coupled to the other end of the capacitor C12, the gate of the transistor MN21, and one end of the switch SW11. This one end of the capacitor C11 is supplied with the reference signal RAMP generated by the reference signal generation unit 13. The one end of the capacitor C12 is coupled to the signal line VSL and the other end thereof is coupled to the other end of the capacitor C11, the gate of the transistor MN21, and the one end of the switch SW11. This one end of the capacitor C12 is supplied with the signal SIG generated by the pixel P.

The gate of the transistor MN21 is coupled to the other ends of the capacitors C11 and C12 and the one end of the switch SW11 through the connection node Nd2. The signal SIG is inputted to the gate of the transistor MN21 through the capacitor C12. In addition, the reference signal RAMP is inputted to the gate of the transistor MN21 through the capacitor C11. It is to be noted that the one end of the capacitor C11 may be configured to be coupled to the buffer circuit 26. The reference signal RAMP may be inputted to the gate of the transistor MN21 through the buffer circuit 26 and the capacitor C11.

The drain of the transistor MN21 is coupled to the drain of the transistor MP21, the gate of the transistor MN22, and the other end of the switch SW11 and the source thereof is coupled to the sources of the transistors MP20 and MN22.

The gate of the transistor MP21 is supplied with the bias voltage VB2, the drain thereof is coupled to the drain of the transistor MN21, the gate of the transistor MN22, and the other end of the switch SW11, and the source thereof is supplied with the power supply voltage VDD0. The transistor MP21 is a load transistor serving as a load of the transistor MN21. The transistor MP21 operates as a constant current source. The switch SW11 is configured to be turned on and off on the basis of the control signal AZSW. The one end of the switch SW11 is coupled to the other ends of the capacitors C11 and C12 and the gate of the transistor MN21 and the other end thereof is coupled to the drains of the transistors MN21 and MP21 and the gate of the transistor MN22. The transistors MN21 and MP21 and the switch SW11 are included in a portion of the initial-stage circuit 101 of the comparison circuit 23A.

The gate of the transistor MN22 is coupled to the drains of the transistors MN21 and MP21 and the other end of the switch SW11, the drain thereof is coupled to the drain of the transistor MP22 and one end of the switch SW12, and the source thereof is coupled to the sources of the transistors MP20 and MN21. The gate of the transistor MP22 is coupled to one end of the capacitor C13 and the other end of the switch SW12, the drain thereof is coupled to the drain of the transistor MN22 and the one end of the switch SW12, and the source thereof is supplied with the power supply voltage VDD0. The switch SW12 is configured to be turned on and off on the basis of the control signal AZP. The one end of the switch SW12 is coupled to the drains of the transistors MN22 and MP22 and the other end thereof is coupled to the gate of the transistor MP22 and the one end of the capacitor C13. The one end of the capacitor C13 is coupled to the gate of the transistor MP22 and the other end of the switch SW12 and the other end thereof is supplied with the power supply voltage VDD0. The transistors MN22 and MP22, the switch SW12, and the capacitor C13 are included in a portion of the post-stage circuit 102 of the comparison circuit 23A.

In addition, the post-stage circuit 102 of the comparison circuit 23A includes the switch SWa. The switch SWa is configured to be turned on and off on the basis of the control signal AZSW2. The control signal AZSW2 is generated by the imaging control unit 15. The switch SWa has one end and another end. The one end of the switch SWa is coupled to the connection node Nd1. The switch SWa allows the impedance and the voltage at the connection node Nd1 to change. The one end of the switch SWa is coupled to the connection node Nd1 and the gate of the transistor MN22 and the other end thereof is coupled to the drain of the transistor MN22. The switch SWa is configured to allow the transistor MN22 to have a diode connection.

The switch SWa in the comparison section 21A according to the modification example 1 corresponds to a specific example of the "first switch" in the technology according to the present disclosure. The switch SW11 corresponds to a specific example of the "second switch" in the technology according to the present disclosure. The transistor MN21 corresponds to a specific example of the "first transistor" in the technology according to the present disclosure. The transistor MN22 corresponds to a specific example of the "second transistor" in the technology according to the present disclosure. The capacitor C11 corresponds to a specific example of the "first capacitor" in the technology according to the present disclosure. The capacitor C12 corresponds to a specific example of the "second capacitor" in the technology according to the present disclosure. The transistor MP21 corresponds to a specific example of the "first load transistor" in the technology according to the present disclosure.

It is also possible for the comparison section 21A according to the modification example 1 to reduce the CDS error by controlling the switch SWa to appropriately turn on and off the switch SWa as with the comparison section 21 illustrated in FIG. 4.

Modification Example 2

Figure 25:
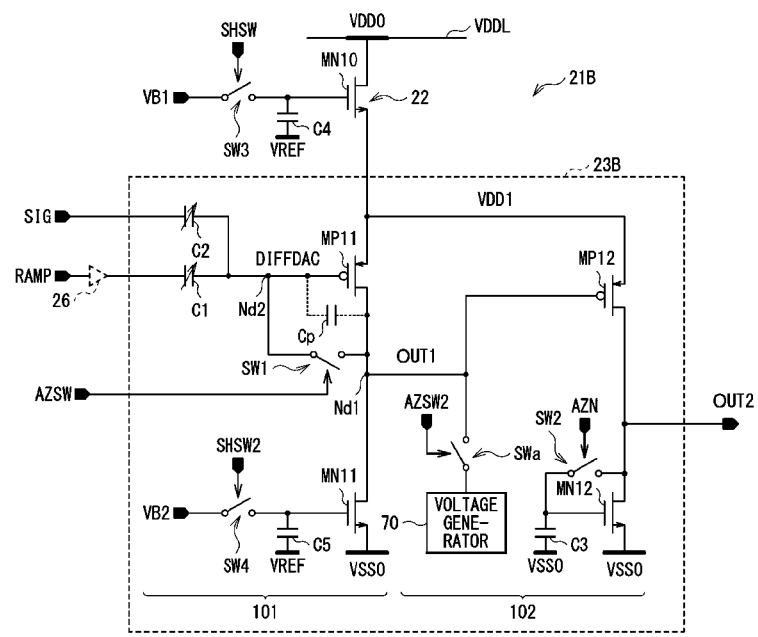
FIG. 25 is a circuit diagram schematically illustrating a configuration example of a comparison section according to a modification example 2.

FIG. 25 schematically illustrates a configuration example of a comparison section 21B according to a modification example 2.

The comparison section 21B according to the modification example 2 includes the power supply circuit 22 and a comparison circuit 23B. The comparison circuit 23B further includes a voltage generator 70 in addition to the components of the comparison circuit 23 illustrated in FIG. 4.

In the comparison circuit 23 illustrated in FIG. 4, the other end of the switch SWa is coupled to the drain of the transistor MP12. The switch SWa is configured to allow the transistor MP12 to have a diode connection. The other end of the switch SWa is, however, coupled to the voltage generator 70 in the comparison circuit 23B according to the modification example 2. This allows the comparison circuit 23B according to the modification example 2 to cause the voltage at the connection node Nd1 to be temporarily fixed to a predetermined fixed voltage by turning on the switch SWa. In addition, it is possible to decrease the impedance at the connection node Nd1 by turning on the switch SWa.

The other configuration and operation may be substantially similar to those of the comparison section 21 illustrated in FIG. 4.

Modification Example 3

Figure 26:
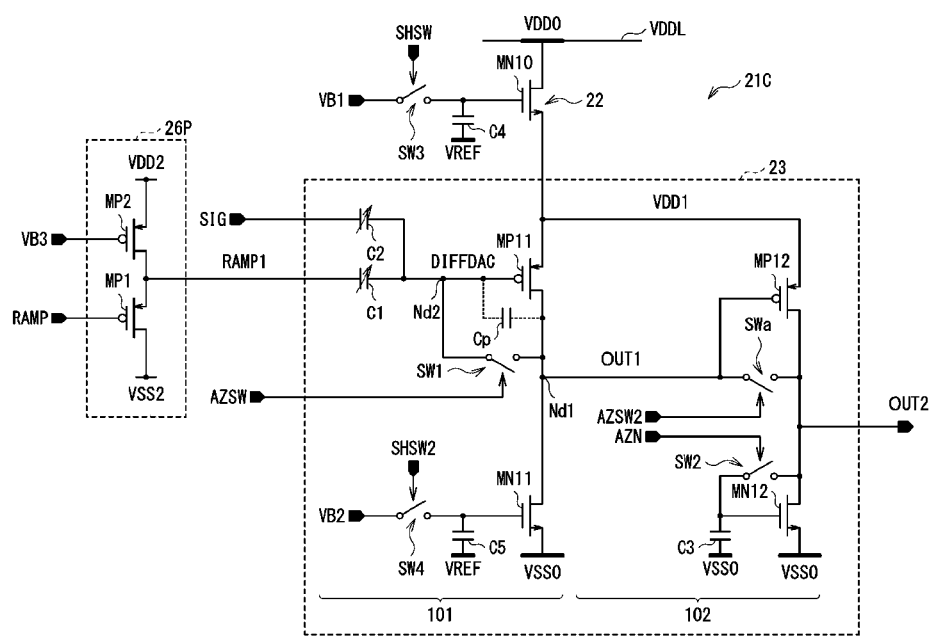
FIG. 26 is a circuit diagram schematically illustrating a configuration example of a comparison section according to a modification example 3.

FIG. 26 schematically illustrates a configuration example of a comparison section 21C according to a modification example 3.

The comparison section 21C according to the modification example 3 includes the power supply circuit 22, the comparison circuit 23, and a buffer circuit 26P.

The buffer circuit 26P is supplied with a power supply voltage VDD2, a ground voltage VSS2, and a bias voltage VB4. The comparison circuit 23 is supplied with the power supply voltage VDD1, the ground voltage VSS0, and the bias voltage VB2. The power supply voltage VDD2 is a voltage higher than the power supply voltage VDD1. This is not, however, limitative. For example, the power supply voltage VDD1 may be the same voltage as the power supply voltage VDD2.

The buffer circuit 26P includes transistors MP1 and MP2. The transistors MP1 and MP2 are P-type MOS transistors. The gate of the transistor MP1 is supplied with the reference signal RAMP, the drain thereof is supplied with the ground voltage VSS2, and the source thereof is coupled to the drain of the transistor MP2 and the comparison circuit 23. The gate of the transistor MP2 is supplied with the bias voltage VB1, the drain thereof is coupled to the source of the transistor MP1 and the comparison circuit 23, and the source thereof is supplied with the power supply voltage VDD2. The transistor MP2 operates as a constant current source. Although not illustrated, the back gates of the transistors MP1 and MP2 are each supplied with the power supply voltage VDD2 in this example. This configuration causes the buffer circuit 26P to operate as a so-called source follower, thereby generating a reference signal RAMP1 on the basis of the reference signal RAMP.

The comparison circuit 23 performs a comparison operation on the basis of the reference signal RAMP1 supplied from the buffer circuit 26P and the signal SIG supplied from the pixel P through the signal line VSL, thereby generating the signal OUT2. The comparison circuit 23 sets an operation point on the basis of the control signals AZSW and AZN supplied from the imaging control unit 15 and then performs a comparison operation.

The other configuration and operation may be substantially similar to those of the comparison section 21 illustrated in FIG. 4.

Modification Example 4

Figure 27:
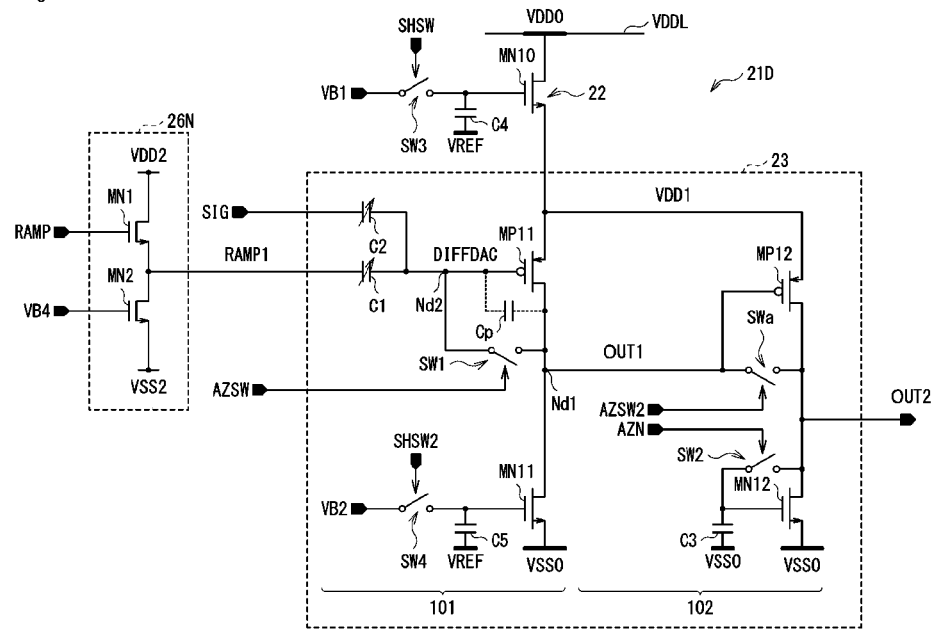
FIG. 27 is a circuit diagram schematically illustrating a configuration example of a comparison section according to a modification example 4.

FIG. 27 schematically illustrates a configuration example of a comparison section 21D according to a modification example 4.

The comparison section 21D according to the modification example 4 includes the power supply circuit 22, the comparison circuit 23, and a buffer circuit 26N.

In the comparison section 21C (FIG. 26) according to the modification example 3, the buffer circuit 26 includes two P-type MOS transistors, but this is not limitative. The buffer circuit 26 may include two N-type MOS transistors as with the buffer circuit 26N illustrated in FIG. 27. This buffer circuit 26N includes transistors MN1 and MN2. The transistors MN1 and MN2 are N-type MOS transistors. The gate of the transistor MN1 is supplied with the reference signal RAMP, the drain thereof is supplied with the power supply voltage VDD2, and the source thereof is coupled to the drain of the transistor MN2 and the comparison circuit 23. The gate of the transistor MN2 is supplied with the bias voltage VB4, the drain thereof is coupled to the source of the transistor MN1 and the comparison circuit 23, and the source thereof is supplied with the ground voltage VSS2. Although not illustrated, the back gates of the transistors MN1 and MN2 are each supplied with the ground voltage VSS2 in this example. This configuration causes the buffer circuit 26N to operate as a so-called source follower, thereby generating the reference signal RAMP1 on the basis of the reference signal RAMP.

The comparison circuit 23 performs a comparison operation on the basis of the reference signal RAMP1 supplied from the buffer circuit 26N and the signal SIG supplied from the pixel P through the signal line VSL, thereby generating the signal OUT2. The comparison circuit 23 sets an operation point on the basis of the control signals AZSW and AZN supplied from the imaging control unit 15 and then performs a comparison operation.

The other configuration and operation may be substantially similar to those of the comparison section 21 illustrated in FIG. 4.

Modification Example 5

Figure 28:
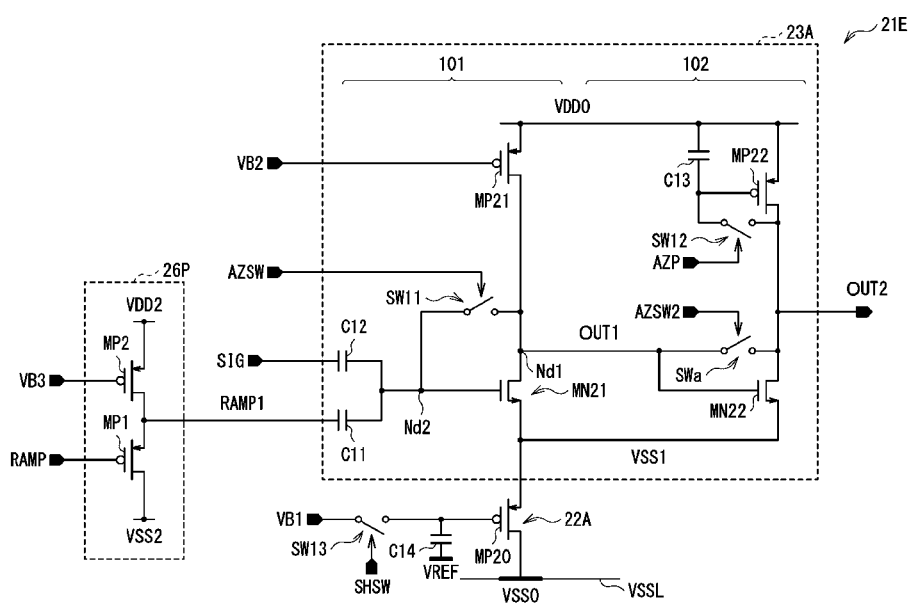
FIG. 28 is a circuit diagram schematically illustrating a configuration example of a comparison section according to a modification example 5.

FIG. 28 schematically illustrates a configuration example of a comparison section 21E according to a modification example 5.

The comparison section 21E according to the modification example 5 includes the power supply circuit 22A, the comparison circuit 23A, and the buffer circuit 26P.

The buffer circuit 26P includes two P-type MOS transistors. A configuration of the buffer circuit 26P is similar to that of the comparison section 21C (FIG. 26) according to the modification example 3. The buffer circuit 26P operates as a so-called source follower, thereby generating the reference signal RAMP1 on the basis of the reference signal RAMP.

The comparison circuit 23A performs a comparison operation on the basis of the reference signal RAMP1 supplied from the buffer circuit 26P and the signal SIG supplied from the pixel P through the signal line VSL, thereby generating the signal OUT2. The comparison circuit 23A sets an operation point on the basis of the control signals AZSW and AZP supplied from the imaging control unit 15 and then performs a comparison operation.

The other configuration and operation may be substantially similar to those of the comparison section 21A illustrated in FIG. 24.

Modification Example 6

Figure 29:
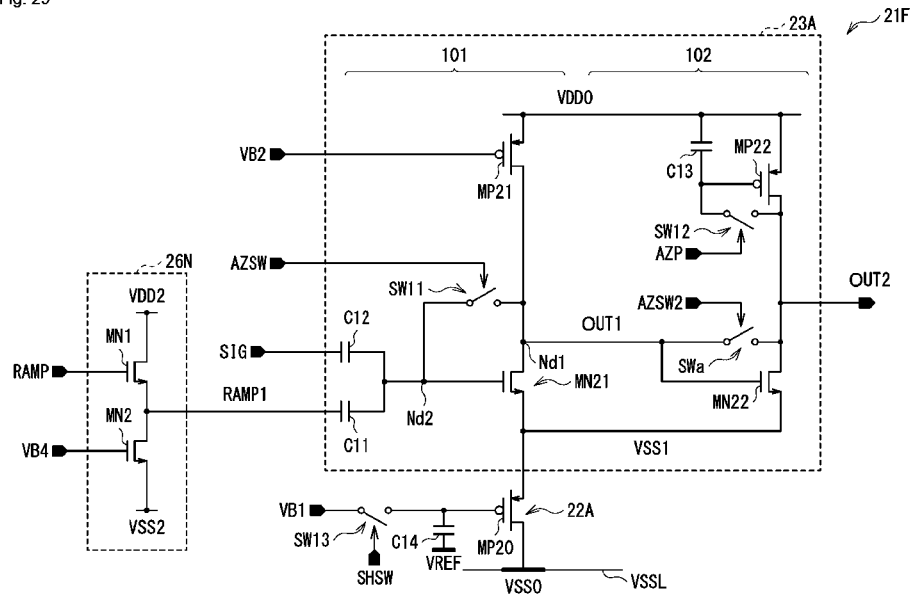
FIG. 29 is a circuit diagram schematically illustrating a configuration example of a comparison section according to a modification example 6.

FIG. 29 schematically illustrates a configuration example of a comparison section 21F according to a modification example 6.

The comparison section 21F according to the modification example 6 includes the power supply circuit 22A, the comparison circuit 23A, and the buffer circuit 26N.

The buffer circuit 26N includes two N-type MOS transistors. A configuration of the buffer circuit 26N is similar to that of the comparison section 21D (FIG. 27) according to the modification example 4. The buffer circuit 26N operates as a so-called source follower, thereby generating the reference signal RAMP1 on the basis of the reference signal RAMP.

The comparison circuit 23A performs a comparison operation on the basis of the reference signal RAMP1 supplied from the buffer circuit 26N and the signal SIG supplied from the pixel P through the signal line VSL, thereby generating the signal OUT2. The comparison circuit 23A sets an operation point on the basis of the control signals AZSW and AZP supplied from the imaging control unit 15 and then performs a comparison operation.

The other configuration and operation may be substantially similar to those of the comparison section 21A illustrated in FIG. 24.

Modification Example 7

Figure 30:
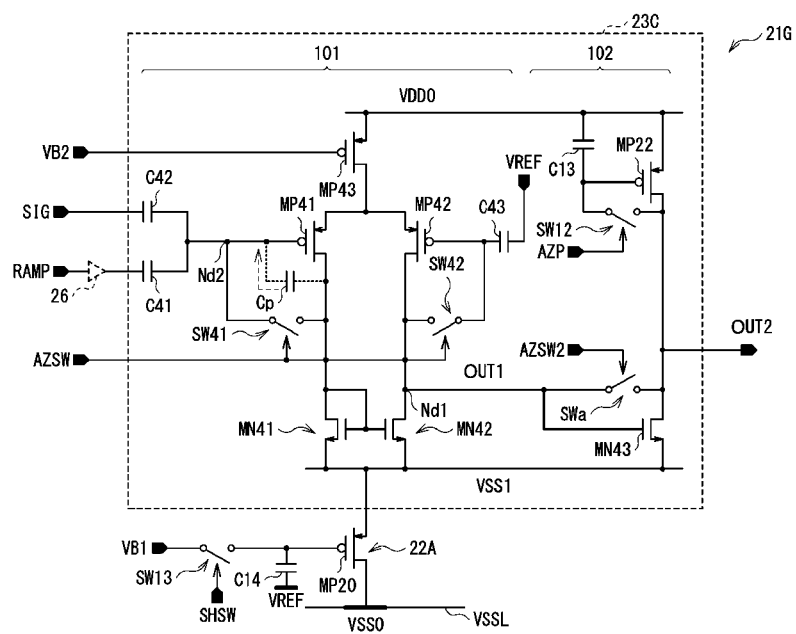
FIG. 30 is a circuit diagram schematically illustrating a configuration example of a comparison section according to a modification example 7.

FIG. 30 schematically illustrates a configuration example of a comparison section 21G according to a modification example 7.

In the comparison section 21 illustrated in FIG. 4, the comparison circuit 23 includes a single-ended circuit. The comparison circuit 23 may, however, include a differential circuit in place of a single-ended circuit.

The comparison section 21G according to the modification example 7 includes the power supply circuit 22A and a comparison circuit 23C including a differential circuit.

The comparison circuit 23C includes the capacitors C13 and C41 to C43, the transistor MP22 and MP41 to MP43, the switches SW12, SW41, and SW42, and transistors MN41 to MN43. The transistors MP22 and MP41 to MP43 are P-type MOS transistors and the transistors MN41 to MN43 are N-type MOS transistors.

Each of the capacitors C41 and C42 has one end and the other end. The one end of the capacitor C41 is supplied with the reference signal RAMP and the other end thereof is coupled to the other end of the capacitor C42, the gate of the transistor MP41, and one end of the switch SW41. The one end of the capacitor C42 is supplied with the signal SIG and the other end thereof is coupled to the other end of the capacitor C41, the gate of the transistor MP41, and the one end of the switch SW41. The direct-current voltage VREF is applied to one end of the capacitor C43. The other end of the capacitor C43 is coupled to the gate of the transistor MP42 and one end of the switch SW42.

The gate of the transistor MP41 is coupled to the other ends of the capacitors C41 and C42 and the one end of the switch SW41 through the connection node Nd2. The signal SIG is inputted to the gate of the transistor MP41 through the capacitor C42. In addition, the reference signal RAMP is inputted to the gate of the transistor MP41 through the capacitor C41. It is to be noted that the one end of the capacitor C41 may be configured to be coupled to the buffer circuit 26. The reference signal RAMP may be inputted to the gate of the transistor MP41 through the buffer circuit 26 and the capacitor C41.

The gate of the transistor MP42 is coupled to the other end of the capacitor C43 and the one end of the switch SW42, the drain thereof is coupled to the drain of the transistor MN42, the other end of the switch SW42, and the gate of the transistor MN43, and the source thereof is coupled to the source of the transistor MP41 and the drain of the transistor MP43. The gate of the transistor MN43 serves as the input terminal of the post-stage circuit 102. The gate of the transistor MP43 is supplied with the bias voltage VB2, the drain thereof is coupled to the sources of the transistors MP41 and MP42 and the comparison circuit 23, and the source thereof is supplied with the power supply voltage VDD0. This transistor MP43 operates as a current source and the transistors MP41 and MP42 operate as a differential pair.

The switch SW41 is configured to be turned on and off on the basis of the control signal AZSW. The one end of the switch SW41 is coupled to the other ends of the capacitors C41 and C42 and the gate of the transistor MP41 and the other end thereof is coupled to the drains of the transistors MP41 and MN41 and the gates of the transistors MN41 and MN42. The switch SW42 is configured to be turned on and off on the basis of the control signal AZSW. The one end of the switch SW42 is coupled to the other end of the capacitor C43 and the gate of the transistor MP42 and the other end thereof is coupled to the drains of the transistors MP42 and MN42 and the gate of the transistor MN43 serving as the input terminal of the post-stage circuit 102.

The gate of the transistor MN41 is coupled to the gate of the transistor MN42, the drains of the transistors MN41 and MP41, and the other end of the switch SW41, the drain thereof is coupled to the gates of the transistors MN41 and MN42, the drain of the transistor MP41, and the other end of the switch SW41, and the source thereof is supplied with the ground voltage VSS1. The gate of the transistor MN42 is coupled to the gate of the transistor MN41, the drains of the transistors MN41 and MP41, and the other end of the switch SW41, the drain thereof is coupled to the gate of the transistor MN43 of the post-stage circuit 102, the drain of the transistor MP42, and the other end of the switch SW42, and the source thereof is supplied with the ground voltage VSS1. In addition, the drains of the transistors MN42 and MP42 are coupled to the connection node Nd1. The transistors MN41 and MN42 operate as loads of the transistors MP41 and MP42 that are a differential pair.

The gate of the transistor MN43 is coupled to the drains of the transistors MN42 and MP42 and the other end of the switch SW42 through the connection node Nd1, the drain thereof is coupled to the drain of the transistor MP22 and the one end of the switch SW12, and the source thereof is supplied with the ground voltage VSS1.

The gate of the transistor MP22 is coupled to the one end of the capacitor C13 and the other end of the switch SW12, the drain thereof is coupled to the drain of the transistor MN43 and the one end of the switch SW12, and the source thereof is supplied with the power supply voltage VDD0. The switch SW12 is configured to be turned on and off on the basis of the control signal AZP. The one end of the switch SW12 is coupled to the drains of the transistors MN43 and MP22 and the other end thereof is coupled to the gate of the transistor MP22 and the one end of the capacitor C13. The one end of the capacitor C13 is coupled to the gate of the transistor MP22 and the other end of the switch SW12 and the other end thereof is supplied with the power supply voltage VDD0.

The power supply circuit 22A includes the transistor MP20. The gate of the transistor MP20 is supplied with the bias voltage VB1, the drain thereof is coupled to the ground line VSSL, and the source thereof is coupled to the sources of the transistors MN41, MN42, and MN43. The transistor MP20 operates as a so-called source follower, thereby outputting the ground voltage VSS1 from the source. The other configuration and operation of the power supply circuit 22A may be substantially similar to those of the modification example 1 illustrated in FIG. 24.

In addition, the post-stage circuit 102 of the comparison circuit 23C includes the switch SWa. The switch SWa is configured to be turned on and off on the basis of the control signal AZSW2. The control signal AZSW2 is generated by the imaging control unit 15. The switch SWa has one end and another end. The one end of the switch SWa is coupled to the connection node Nd1. The switch SWa allows the impedance and the voltage at the connection node Nd1 to change. The one end of the switch SWa is coupled to the connection node Nd1 and the gate of the transistor MN43 and the other end thereof is coupled to the drain of the transistor MN43. The switch SWa is configured to allow the transistor MN43 to have a diode connection.

The switch SWa in the comparison section 21G according to the modification example 7 corresponds to a specific example of the "first switch" in the technology according to the present disclosure. The switch SW41 corresponds to a specific example of the "second switch" in the technology according to the present disclosure. The connection node Nd1 corresponds to a specific example of the "connection node" in the technology according to the present disclosure. The transistor MP41 corresponds to a specific example of the "first transistor" in the technology according to the present disclosure. The transistor MN43 corresponds to a specific example of the "second transistor" in the technology according to the present disclosure. The transistor MP42 corresponds to a specific example of a "third transistor" in the technology according to the present disclosure. The capacitor C41 corresponds to a specific example of the "first capacitor" in the technology according to the present disclosure. The capacitor C42 corresponds to a specific example of the "second capacitor" in the technology according to the present disclosure. The transistor MN41 corresponds to a specific example of the "first load transistor" in the technology according to the present disclosure. The transistor MN42 corresponds to a specific example of a "second load transistor" in the technology according to the present disclosure.

Figure 31:
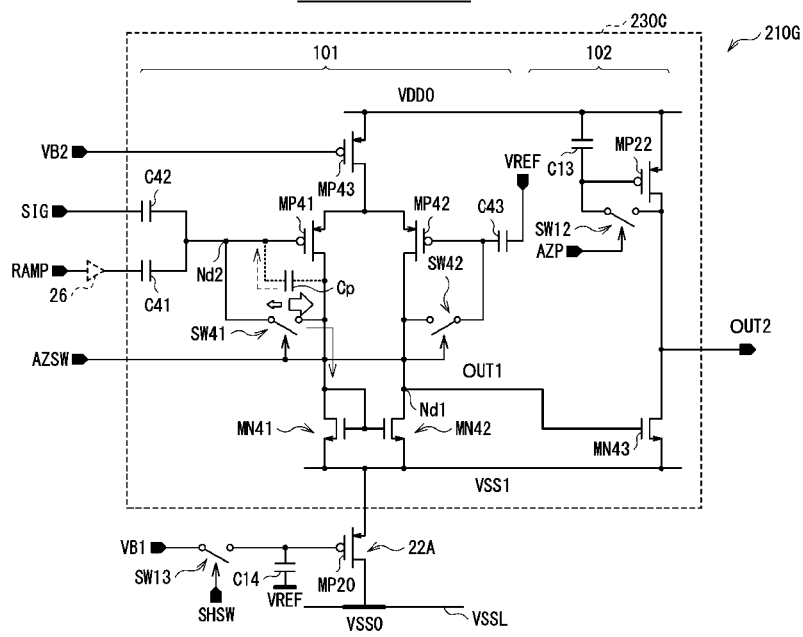
FIG. 31 is a circuit diagram schematically illustrating a configuration example of a comparison section according to a comparative example for the modification example 7.

FIG. 31 schematically illustrates a configuration example of a comparison section 210G according to a comparative example for the modification example 7.

The comparison section 210G according to the comparative example includes a comparison circuit 230C having a configuration in which the switch SWa is omitted from the components of the comparison section 21G illustrated in FIG. 30. The other components are similar to those of the comparison section 21G illustrated in FIG. 30.

In the comparison circuit 230C according to the comparative example, the other end side of the switch SW41 is coupled to the transistor MN41 that is a load transistor having a diode connection, resulting in low impedance. This facilitates electric charge to flow onto the other end side of the switch SW41 rather than the one end side (connection node Nd2 side) of the switch SW41 in a case where the switch SW41 that has been on to cause charge injection. The charge injection of the switch SW41 therefore has less influence on the gate voltage (voltage DIFFDAC) of the transistor MP41.

In contrast, the parasitic capacitance Cp between the gate and the drain of the transistor MP41 has influence. In the comparison circuit 230C according to the comparative example, a voltage change in the signal OUT1 interferes with the voltage DIFFDAC at the connection node Nd2 through the parasitic capacitance Cp. It is also possible for the comparison section 21G according to the modification example 7 to reduce the influence of the parasitic capacitance Cp and reduce the CDS error by controlling the switch SWa to appropriately turn on and off the switch SWa as with the comparison section 21 illustrated in FIG. 4.

Modification Example 8

Figure 32:
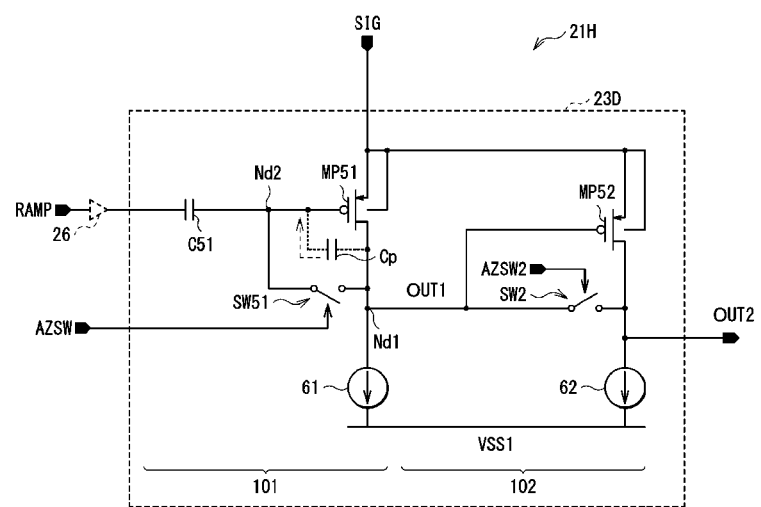
FIG. 32 is a circuit diagram schematically illustrating a configuration example of a comparison section according to a modification example 8.

FIG. 32 schematically illustrates a configuration example of a comparison section 21H according to a modification example 8.

The comparison section 21H includes a comparison circuit 23D including the initial-stage circuit 101 and the post-stage circuit 102. The initial-stage circuit 101 is configured to output the signal OUT1 corresponding to a comparison operation based on the signal SIG and the reference signal RAMP. The post-stage circuit 102 is coupled to the initial-stage circuit 101 through the connection node Nd1. The post-stage circuit 102 is configured to output the signal OUT2 corresponding to the signal OUT1 outputted from the initial-stage circuit 101 through the connection node Nd1.

The initial-stage circuit 101 includes a capacitor C51, a transistor MPS, a switch SW51, and a constant current source 61. The post-stage circuit 102 includes a transistor MP52, the switch SWa, and a constant current source 62. Transistors MP51 and MP52 are P-type MOS transistors.

The capacitor C51 has one end and the other end. The one end of the capacitor C51 is coupled to the reference signal generation unit 13 and the other end thereof is coupled to the gate of the transistor MP51 and one end of the switch SW51 through the connection node Nd2. This one end of the capacitor C51 is supplied with the reference signal RAMP generated by the reference signal generation unit 13.

The gate of the transistor MP51 is coupled to the other end of the capacitor C51 and the one end of the switch SW51 through the connection node Nd2. The signal SIG generated by the pixel P is inputted to the source of the transistor MP51. In addition, the reference signal RAMP is inputted to the gate of the transistor MP51 through the capacitor C51. It is to be noted that the one end of the capacitor C51 may be configured to be coupled to the buffer circuit 26. The reference signal RAMP may be inputted to the gate of the transistor MP51 through the buffer circuit 26 and the capacitor C51.

The switch SW51 is configured to be turned on and off on the basis of the control signal AZSW. The one end of the switch SW51 is coupled to the other end of the capacitor C51 and the gate of the transistor MP51 through the connection node Nd2 and the other end thereof is coupled to the gate of the transistor MP52 through the connection node Nd1. In addition, the other end of the switch SW51 is coupled to the drain of the transistor MP51. In addition, the other end of the switch SW51 is coupled to the one end of the switch SWa through the connection node Nd1.

The constant current source 61 is coupled to the drain of the transistor MP51, the gate of the transistor MP52, and the other end of the switch SW51 through the connection node Nd1. In addition, the constant current source 61 is coupled to the one end of the switch SWa through the connection node Nd1. The constant current source 61 is supplied with the ground voltage VSS1.

The gate of the transistor MP52 is coupled to the drain of the transistor MP51 and the other end of the switch SW51 through the connection node Nd1. The drain of the transistor MP52 is coupled to the constant current source 62 and the source thereof is coupled to the source of the transistor MP51. In addition, the drain of the transistor MP52 is coupled to the other end of the switch SWa.

The constant current source 62 is coupled to the drain of the transistor MP52. The constant current source 62 is supplied with the ground voltage VSS1. In addition, the constant current source 62 is coupled to the other end of the switch SWa.

The switch SWa is configured to be turned on and off on the basis of the control signal AZSW2. The control signal AZSW2 is generated by the imaging control unit 15. The switch SWa has one end and another end. The one end of the switch SWa is coupled to the connection node Nd1. The switch SWa allows the impedance and the voltage at the connection node Nd1 to change. The one end of the switch SWa is coupled to the connection node Nd1 and the gate of the transistor MP52 and the other end thereof is coupled to the drain of the transistor MP52. The switch SWa is configured to allow the transistor MP52 to have a diode connection.

The switch SWa in the comparison section 21H according to the modification example 8 corresponds to a specific example of the "first switch" in the technology according to the present disclosure. The switch SW51 corresponds to a specific example of the "second switch" in the technology according to the present disclosure. The connection node Nd1 corresponds to a specific example of the "connection node" in the technology according to the present disclosure. The transistor MP51 corresponds to a specific example of the "first transistor" in the technology according to the present disclosure. The transistor MP52 corresponds to a specific example of the "second transistor" in the technology according to the present disclosure. The capacitor C41 corresponds to a specific example of the "first capacitor" in the technology according to the present disclosure.

Figure 33:
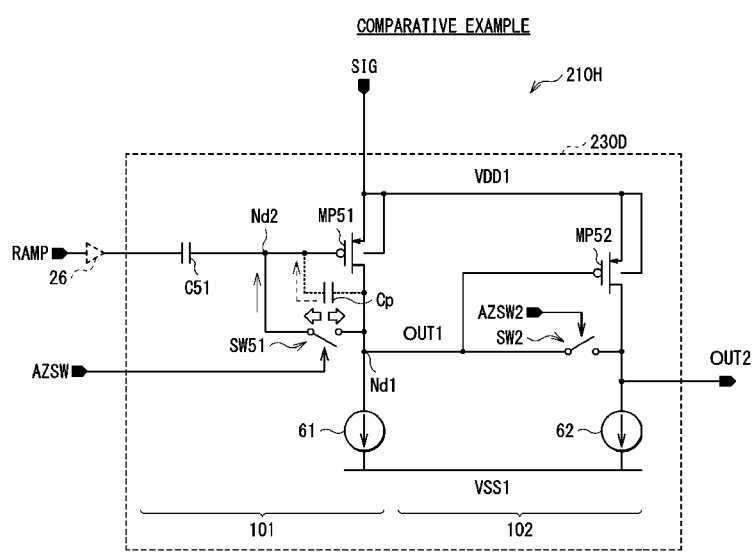
FIG. 33 is a circuit diagram schematically illustrating a configuration example of a comparison section according to a comparative example for the modification example 8.

FIG. 33 schematically illustrates a configuration example of a comparison section 210H according to a comparative example for the modification example 8.

The comparison section 210H according to the comparative example includes a comparison circuit 230D having a configuration in which the switch SWa is omitted from the components of the comparison section 21H illustrated in FIG. 32. The other components are similar to those of the comparison section 21H illustrated in FIG. 32.

In a case where the switch SW41 that has been on is turned off to cause charge injection in the comparison circuit 230D according to the comparative example, electric charge is facilitated to flow onto the one end side (connection node Nd2 side) of the switch SW51. In the comparison circuit 230D according to the comparative example, the signal SIG generated by the pixel P is, however, inputted to the source of the transistor MP51. This causes the charge injection of the switch SW51 to have less influence on the signal SIG.

In contrast, the parasitic capacitance Cp between the gate and the drain of the transistor MP51 has influence. In the comparison circuit 230D according to the comparative example, a voltage change in the signal OUT1 interferes with the voltage DIFFDAC at the connection node Nd2 through the parasitic capacitance Cp. It is also possible for the comparison section 21H according to the modification example 8 to reduce the influence of the parasitic capacitance Cp and reduce the CDS error by controlling the switch SWa to appropriately turn on and off the switch SWa as with the comparison section 21 illustrated in FIG. 4.

The other configuration and operation may be substantially similar to those of the comparison section 21 illustrated in FIG. 4.

2. Usage Example of Imaging Device

Figure 34:
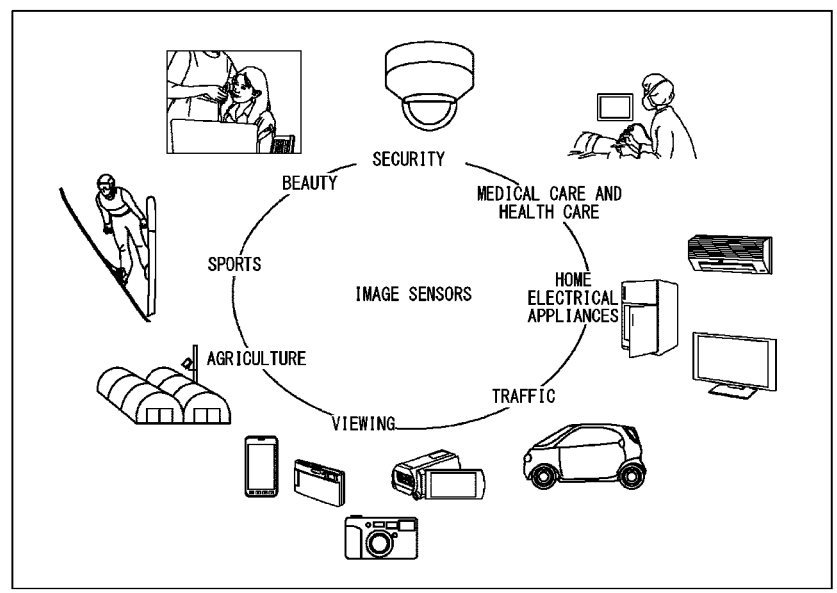
FIG. 34 is an explanatory diagram illustrating a usage example of the imaging device.

FIG. 34 illustrates a usage example of the imaging device 1 according to the embodiment described above. For example, the imaging device 1 described above is usable in a variety of cases of sensing light such as visible light, infrared light, ultraviolet light, and X-ray as follows.

- Apparatuses that shoot images for viewing such as digital cameras or mobile apparatuses each having a camera function
- Apparatuses for traffic use such as onboard sensors that shoot images of the front, back, surroundings, inside, and so on of an automobile for safe driving such as automatic stop and for recognizing a driver's state, monitoring cameras that monitor traveling vehicles and roads, or distance measurement sensors that measure vehicle-to-vehicle distance
- Apparatuses for use in home electrical appliances such as televisions, refrigerators, or air-conditioners to shoot images of a user's gesture and bring the appliances into operation in accordance with the gesture
- Apparatuses for medical care and health care use such as endoscopes or apparatuses that shoot images of blood vessels by receiving infrared light
- Apparatuses for security use such as monitoring cameras for crime prevention or cameras for individual authentication
- Apparatuses for beauty use such as skin measurement apparatuses that shoot images of skin or microscopes that shoot images of scalp
- Apparatuses for sports use such as action cameras or wearable cameras for sports applications and the like
- Apparatuses for agricultural use such as cameras for monitoring the conditions of fields and crops

3. Examples of Practical Application to Mobile Body

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

Figure 35:
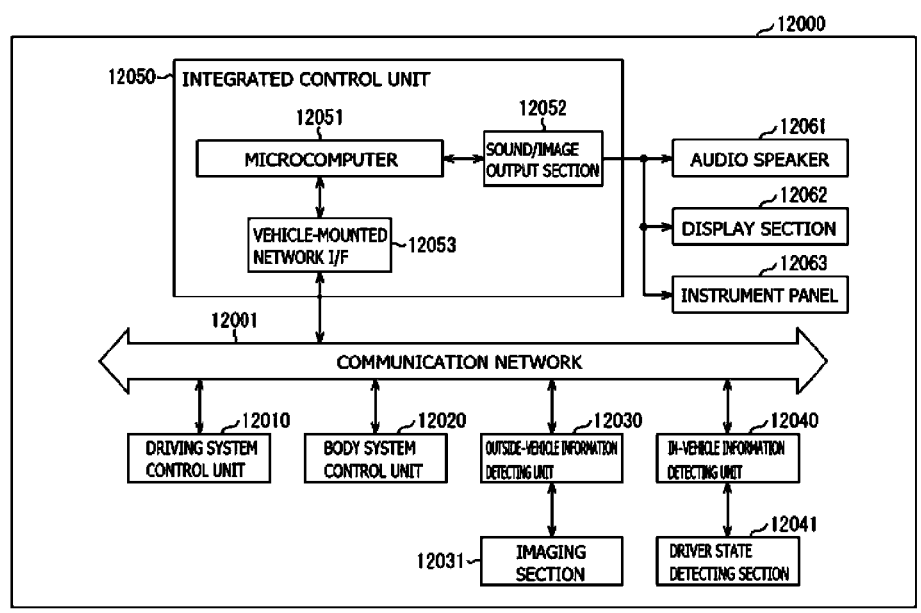
FIG. 35 is a block diagram depicting an example of schematic configuration of a vehicle control system.

FIG. 35 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 35, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 35, an audio speaker 12061, a display section 12062, and an instrument panel 12063 are illustrated as the output device. The display section 12062 may, for example, include at least one of an on-board display and a head-up display.

Figure 36:
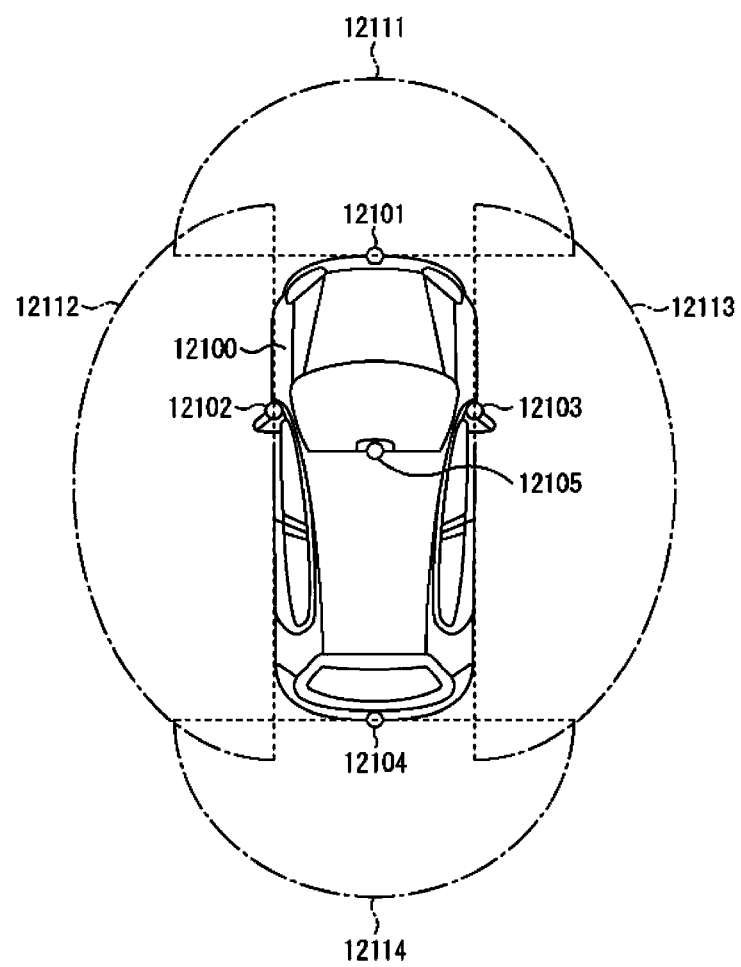
FIG. 36 is a diagram of assistance in explaining an example of installation positions of an outside-vehicle information detecting section and an imaging section.

FIG. 36 is a diagram depicting an example of the installation position of the imaging section 12031.

In FIG. 36, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 36 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to the present disclosure may be applied has been described above. The technology according to the present disclosure may be applied to the imaging section 12031 among the components described above. This makes it possible in the vehicle control system 12000 to increase the image quality of a captured image. As a result, the vehicle control system 12000 allows for an increase in the accuracy of a collision avoidance or collision mitigation function for the vehicle, a following driving function based on vehicle-to-vehicle distance, a vehicle speed maintaining driving function, a warning function of collision of the vehicle, a warning function of deviation of the vehicle from a lane, and the like.

4. Example of Practical Application to Distance Measurement Device

Next, an example of a case where the present technology is applied to a distance measurement device is described in detail.

Figure 37:
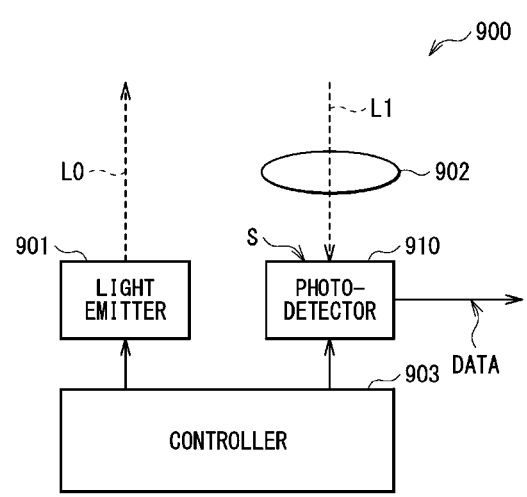
FIG. 37 is a block diagram illustrating a configuration example of a distance measurement device according to a practical application example.

FIG. 37 illustrates a configuration example of a distance measurement device 900 according to the present practical application example. The distance measurement device 900 is configured to measure the distance to a measurement object OBJ in an indirect method. The distance measurement device 900 includes a light emitter 901, an optical system 902, a photodetector 910, and a controller 903.

The light emitter 901 is configured to emit a light pulse L0 toward the measurement object OBJ. The light emitter 901 emits the light pulse L0 on the basis of an instruction from the controller 903 by performing a light emission operation of alternately repeating the emission and non-emission of light. The light emitter 901 includes, for example, a light source that emits infrared light. This light source includes, for example, a laser light source, an LED (Light Emitting Diode), or the like.

The optical system 902 includes a lens that forms an image on a light receiving surface S of the photodetector 910. A light pulse (reflection light pulse L1) emitted from the light emitter 901 and reflected by the measurement object OBJ enters this optical system 902.

The photodetector 910 is configured to detect light to generate a distance image PIC on the basis of an instruction from the controller 903. Each of a plurality of pixel values included in the distance image PIC indicates a value about distance D to the measurement object OBJ. The photodetector 910 then outputs the generated distance image PIC as the image signal DATA.

The controller 903 is configured to supply the light emitter 901 and the photodetector 910 with control signals and control operations of these light emitter 901 and photodetector 910, thereby controlling an operation of the distance measurement device 900.

Figure 38:
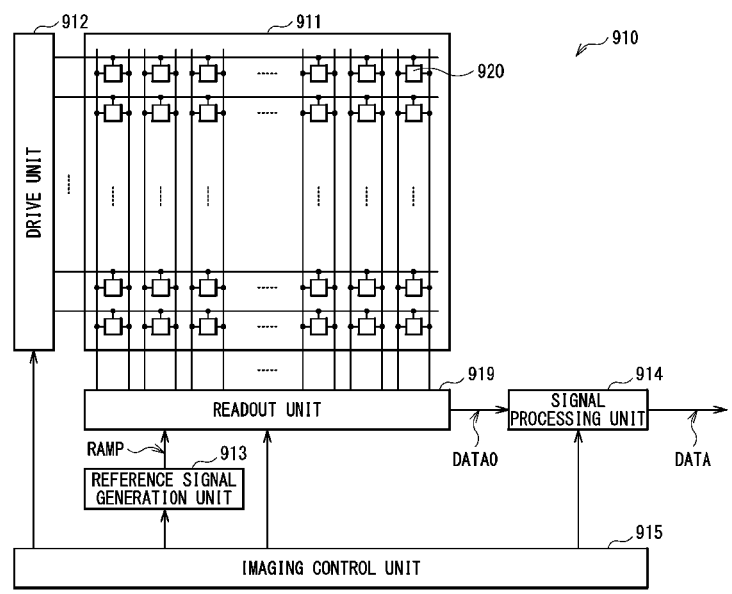
FIG. 38 is a block diagram illustrating a configuration example of a photodetector illustrated in FIG. 37.

FIG. 38 illustrates a configuration example of the photodetector 910. The photodetector 910 includes a pixel array 911, a drive unit 912, a reference signal generation unit 913, a readout unit 919, a signal processing unit 914, and an imaging control unit 915. For example, the pixel array 911, the drive unit 912, the reference signal generation unit 913, the readout unit 919, the signal processing unit 914, and the imaging control unit 915 may be formed in one semiconductor substrate. In addition, the pixel array 911 may be formed in one semiconductor substrate and the drive unit 912, the reference signal generation unit 913, the readout unit 919, the signal processing unit 914, and the imaging control unit 915 may be formed in another semiconductor substrate. These two semiconductor substrates may be superimposed.

The pixel array 911 includes a plurality of pixels 920 disposed in a matrix. Each of the pixels 920 is configured to generate the pixel voltage Vpix corresponding to the amount of received light.

Figure 39:
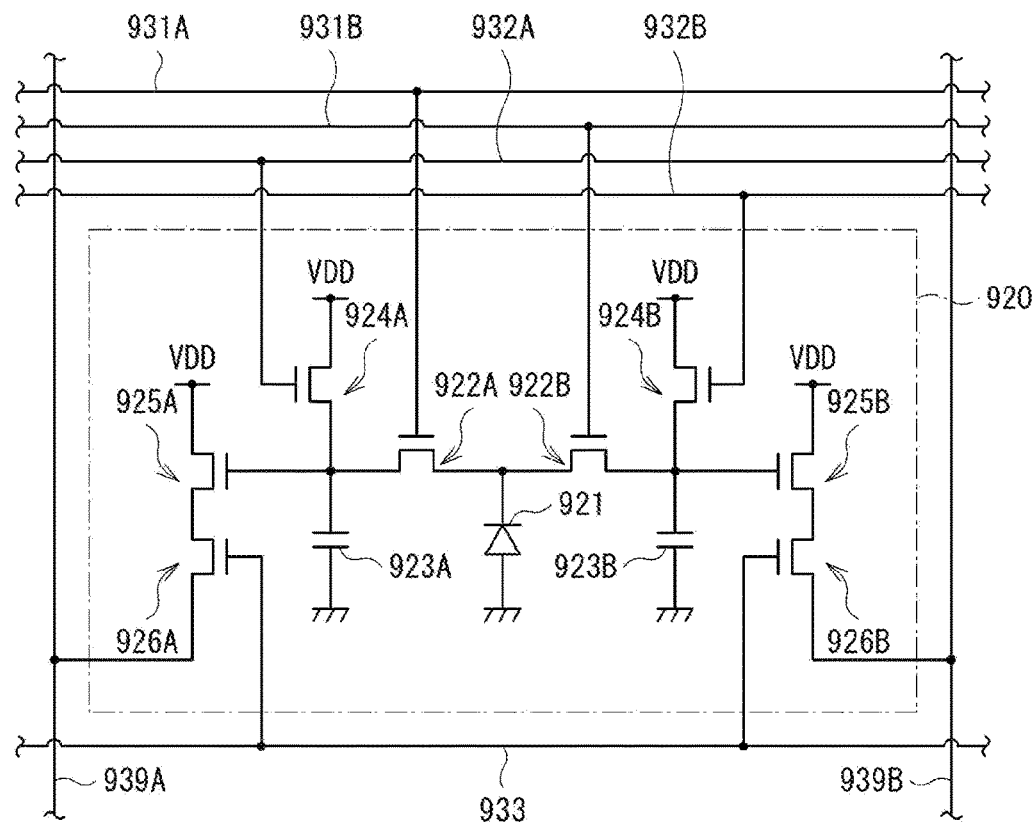
FIG. 39 is a circuit diagram illustrating a configuration example of a pixel illustrated in FIG. 38.

FIG. 39 illustrates a configuration example of the pixel 920. The pixel array 911 includes a plurality of control lines 931A, a plurality of control lines 931B, a plurality of control lines 932A, the plurality of control lines 932A, a plurality of control lines 933, a plurality of signal lines 939A, and a plurality of signal lines 939B.

The pixel 920 includes a photodiode 921, floating diffusions 923A and 923B, and transistors 922A, 922B, 924A, 924B, 925A, 925B, 926A, and 926B. A circuit including the photodiode 921, the floating diffusion 923A, and the transistors 922A, 924A, 925A, and 926A is also referred to as a tap A. In addition, a circuit including the photodiode 921, the floating diffusion 923B, and the transistors 922B, 924B, 925B, and 926B is also referred to as a tap B.

In the tap A, the gate of the transistor 922A is coupled to the control line 931A, the source thereof is coupled to the photodiode 921, and the drain thereof is coupled to the floating diffusion 923A. The floating diffusion 923A is configured to accumulate electric charge supplied from the photodiode 921 through the transistor 922A. The gate of the transistor 924A is coupled to the control line 932A, the drain thereof is supplied with the power supply voltage VDD, and the source thereof is coupled to the floating diffusion 923A. The gate of the transistor 925A is coupled to the floating diffusion 923A, the drain thereof is supplied with the power supply voltage VDD, and the source thereof is coupled to the drain of the transistor 926A. The gate of the transistor 926A is coupled to the control line 933, the drain thereof is coupled to the source of the transistor 925A, and the source thereof is coupled to the signal line 939A. The tap A has been described above as an example and the same applies to the tap B.

According to this configuration, the transistor 924A is turned on to reset the floating diffusion 923A and the transistor 924B is turned on to reset the floating diffusion 923B in the pixel 920. Any one of the transistor 922A or 922B is then alternately turned on to selectively accumulate electric charge generated by the photodiode 921 in the floating diffusion 923A and the floating diffusion 923B. The transistors 926A and 926B are then turned on to cause the pixel 920 to output a pixel signal corresponding to the amount of electric charge accumulated in the floating diffusion 923A to the signal line 939A and output a pixel signal corresponding to the amount of electric charge accumulated in the floating diffusion 923B to the signal line 939B.

The drive unit 912 (FIG. 38) is configured to sequentially drive the plurality of pixels 920 in the pixel array 911 in units of the pixel lines L on the basis of an instruction from the imaging control unit 915. The reference signal generation unit 913 is configured to generate the reference signal RAMP on the basis of an instruction from the imaging control unit 915. The readout unit 919 is configured to generate the image signal DATA0 on the basis of an instruction from the imaging control unit 915 by performing AD conversion on the basis of pixel signals supplied from the pixel array 911 through the signal lines 939A and 939B. The signal processing unit 914 is configured to perform predetermined signal processing on the image signal DATA0 to generate the distance image PIC on the basis of an instruction from the imaging control unit 915 and output the image signal DATA including this distance image PIC. The imaging control unit 915 is configured to supply control signals to the drive unit 912, the reference signal generation unit 913, the readout unit 919, and the signal processing unit 914 and control operations of these circuits, thereby controlling an operation of the photodetector 910.

Figure 40A:
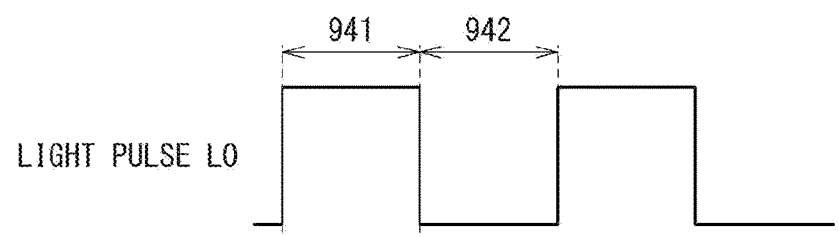
FIGS. 40A and 40B are waveform charts illustrating an operation example of the distance measurement device illustrated in FIG. 37.
Figure 40B:
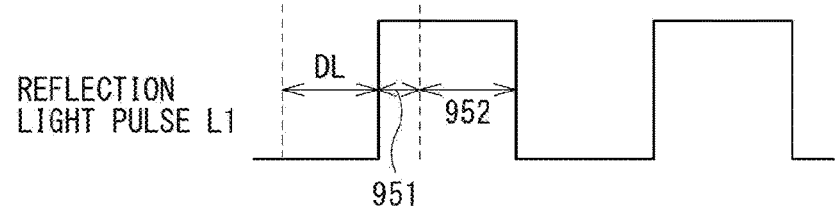

FIGS. 40A and 40B illustrate an operation example of the distance measurement device 900. FIG. 40A illustrates the waveform of the light pulse L0 to be emitted from the light emitter 901 and FIG. 40B illustrates the waveform of the reflection light pulse L1 to be detected by the photodetector 910.

The light emitter 901 emits the light pulse L0 having a pulse waveform with a duty ratio of 50% on the basis of an instruction from the controller 903 (FIG. 40A). This light pulse L0 travels toward the measurement object OBJ. This light pulse L0 is then reflected by the measurement object OBJ and the reflected reflection light pulse L1 travels toward the photodetector 910. The pixel 920 of this photodetector 910 then detects this reflection light pulse L1 (FIG. 40B). The reflection light pulse L1 detected by the pixel 920 has a waveform obtained by delaying the waveform of the light pulse L0 illustrated in FIG. 40A by a delay time DL. This delay time DL is a time in which light travels in the order of the light emitter 901, the measurement object OBJ, and the photodetector 910. The delay time DL corresponds to the flight time of light. This flight time of light corresponds to the distance between the distance measurement device 900 and the measurement object OBJ.

In the indirect method, the floating diffusion 923A of the pixel 920 accumulates signal charge Q1 corresponding to the amount of light received by the photodiode 921 in a period 941 in which the light emitter 901 emits light. The floating diffusion 923B of the pixel 920 accumulates signal charge Q2 corresponding to the amount of light received by the photodiode 921 in a period 942 in which the light emitter 901 emits no light. The signal processing unit 914 then obtains the electric charge ratio between the signal charge Q1 and the signal charge Q2. The photodiode 921 detects light in periods 951 and 952. The electric charge amount of the signal charge Q1 is therefore proportional to the length of the period 951 and the electric charge amount of the signal charge Q2 is proportional to the length of the period 952. In a case where the delay time DL is short, the signal charge Q1 is increased and the signal charge Q2 is decreased. In a case where the delay time DL is long, the signal charge Q1 is decreased and the signal charge Q2 are increased. In this way, the electric charge ratio between the signal charge Q1 and the signal charge Q2 is changed depending on the delay time DL. In the indirect method, obtaining this electric charge ratio makes it possible to obtain the delay time DL with high accuracy, for example. As a result, it is possible to measure the distance to the measurement object OBJ with high accuracy. The present technology is applicable to this readout unit 919. This makes it possible to increase the image quality of a distance image.

The example of the distance measurement device 900 to which the technology according to the present disclosure may be applied has been described above. The technology according to the present disclosure may be applied to the distance measurement device 900 like this. This makes it possible to increase the image quality of a distance image in the distance measurement device 900.

5. Other Embodiments

The technology according to the present disclosure is not limited to the description of the embodiment and the modification examples described above, but may be modified and carried out in a variety of ways.

For example, in the embodiment described above, the pixel P is configured as illustrated in FIG. 2, but this is not limitative. It is possible to use pixels having various configurations.

For example, the present technology may also have configurations as follows.

The present technology having the following configurations couples the one end of the first switch to the connection node between the first-stage amplifier circuit and the second-stage amplifier circuit and allows the impedance and the voltage at the connection node to change. This makes it possible to accurately perform the noise reduction process.

(1)
A photodetection device including:
a pixel configured to generate a pixel signal;
a reference signal generation unit configured to generate a reference signal;
a comparison circuit including a first-stage amplifier circuit and a second-stage amplifier circuit that is coupled to the first-stage amplifier circuit through a connection node, the first-stage amplifier circuit being configured to output a first output signal corresponding to a comparison operation based on the pixel signal and the reference signal, the second-stage amplifier circuit being configured to output a second output signal corresponding to the first output signal outputted from the first-stage amplifier circuit through the connection node; and
a first switch having one end and another end, the one end being coupled to the connection node, the first switch allowing impedance and a voltage at the connection node to change.

(2)
The photodetection device according to (1), in which the first-stage amplifier circuit includes a first transistor to which the pixel signal and the reference signal are inputted, the first transistor having a gate, a drain, and a source.

(3)
The photodetection device according to (1) or (2), in which
the second-stage amplifier circuit includes a second transistor having a gate coupled to the connection node and a drain configured to output the second output signal, and
the one end of the first switch is coupled to the connection node and the gate of the second transistor, the other end of the first switch is coupled to the drain of the second transistor, and the first switch is configured to allow the second transistor to have a diode connection.

(4)

The photodetection device according to (3), in which
the first switch includes a MOS transistor having a gate, a drain, and a source, and
a control signal is inputted to the gate of the MOS transistor, the source of the MOS transistor is coupled to the connection node and the gate of the second transistor, and the drain of the MOS transistor is coupled to the drain of the second transistor, the control signal controlling the first switch to turn on and off the first switch.

(5)

The photodetection device according to (1) or (2), further including a voltage generator that is coupled to the other end of the first switch, in which
the second-stage amplifier circuit includes a second transistor having a gate coupled to the connection node and a drain configured to output the second output signal, and
the one end of the first switch is coupled to the connection node and the gate of the second transistor and the other end of the first switch is coupled to the voltage generator.

(6)

The photodetection device according to any one of (2) to (5), in which
the first-stage amplifier circuit further includes a second switch configured to couple the gate of the first transistor and the drain of the first transistor by being turned on, and
the first switch causes the impedance at the connection node to temporarily decrease by being temporarily turned on in a period including a timing at which at least the second switch that has been on is turned off.

(7)

The photodetection device according to any one of (2) to (6), in which
the pixel outputs a signal serving as a pixel voltage corresponding to an amount of received light in a second period after outputting, as the pixel signal, a signal serving as a reset voltage in a first period,
the first transistor is configured to have a predetermined reference voltage as a gate voltage thereof in a predetermined period after the first period ends and have a voltage lower than the predetermined reference voltage after the predetermined period ends, and
the first switch causes the voltage at the connection node to be temporarily fixed to a predetermined fixed voltage by being turned on at a timing at which the first period ends and being turned off at a timing at which the predetermined period ends.

(8)

The photodetection device according to any one of (2) to (7), in which
the first-stage amplifier circuit further includes a first capacitor to which the reference signal is inputted and a second capacitor to which the pixel signal is inputted, and
the reference signal is inputted to the gate of the first transistor through the first capacitor and the pixel signal is inputted to the gate of the first transistor through the second capacitor.

(9)

The photodetection device according to (8), in which the drain of the first transistor is coupled to the connection node.

(10)

The photodetection device according to (8) or (9), in which the first-stage amplifier circuit further includes a first load transistor that is coupled to the drain of the first transistor and the connection node.

(11)

The photodetection device according to any one of (8) to (10), further including a buffer circuit to which the reference signal is inputted, the buffer circuit being coupled to the first capacitor, in which
the reference signal is inputted to the gate of the first transistor through the buffer circuit and the first capacitor.

(12)

The photodetection device according to any one of (2) to (7), in which the first-stage amplifier circuit further includes a third transistor having a gate, a drain, and a source, the third transistor operating as a differential pair along with the first transistor.

(13)

The photodetection device according to (12), in which the drain of the third transistor is coupled to the connection node.

(14)

The photodetection device according to (12) or (13), in which the first-stage amplifier circuit further includes
a first load transistor that is coupled to the drain of the first transistor, and
a second load transistor that is coupled to the drain of the third transistor and the connection node.

(15)

The photodetection device according to any one of (2) to (7), in which
the first-stage amplifier circuit further includes a first capacitor to which the reference signal is inputted, and
the reference signal is inputted to the gate of the first transistor through the first capacitor and the pixel signal is inputted to the source of the first transistor.

(16)

An electronic apparatus including
a photodetection device, in which
the photodetection device includes
a pixel configured to generate a pixel signal,
a reference signal generation unit configured to generate a reference signal,
a comparison circuit including a first-stage amplifier circuit and a second-stage amplifier circuit that is coupled to the first-stage amplifier circuit through a connection node, the first-stage amplifier circuit being configured to output a first output signal corresponding to a comparison operation based on the pixel signal and the reference signal, the second-stage amplifier circuit being configured to output a second output signal corresponding to the first output signal outputted from the first-stage amplifier circuit through the connection node, and
a first switch having one end and another end, the one end being coupled to the connection node, the first switch allowing impedance and a voltage at the connection node to change.

This application claims the priority on the basis of Japanese Patent Application No. 2020-108108 filed on Jun. 23, 2020 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A photodetection device, comprising:
a pixel configured to:
receive light; and
generate a pixel signal in a first period, wherein the pixel signal is associated with a first amount of the received light;
a reference signal generation unit configured to generate a reference signal;
a comparison circuit including that a first-stage amplifier circuit and a second-stage amplifier circuit, wherein
the second-stage amplifier circuit is coupled to the first-stage amplifier circuit through a connection node,
the first-stage amplifier circuit includes a first transistor,
the first transistor configured to receive the pixel signal and the reference signal,
the first transistor includes a first gate, a first drain, and a first source,
the comparison circuit is configured to compare the pixel signal and the reference signal based on a first control signal,
the first-stage amplifier circuit is configured to output a first output signal based on the comparison between the pixel signal and the reference signal,
the second-stage amplifier circuit is configured to output a second output signal,
the second output signal corresponds to the first output signal; and
a first switch that includes a first end and a second end, wherein
the first end is coupled to the connection node, and
the first switch is configured to change a specific impedance and a specific voltage at the connection node based on the first control signal.

2. The photodetection device according to claim 1, wherein
the second-stage amplifier circuit includes a second transistor,
the second transistor includes a second gate and a second drain,
the second gate is coupled to the connection node,
the second drain is configured to output the second output signal,
the first end of the first switch is coupled to the connection node and the second gate,
the second end of the first switch is coupled to the second drain, and
the first switch is further configured to connect the second transistor with the connection node.

3. The photodetection device according to claim 2, wherein
the first switch further includes a MOS transistor,
the MOS transistor includes a third gate, a third drain, and a third source,
the MOS transistor is configured to receive a second control signal,
the reception of the second control signal is at the third gate,
the MOS transistor is configured to one of turn on the first switch or turn off the first switch based on the second control signal,
the third source is coupled to the connection node and the second gate, and
the third drain is coupled to the second drain.

4. The photodetection device according to claim 1, further comprising a voltage generator coupled to the second end of the first switch, wherein
the second-stage amplifier circuit further includes a second transistor,
the second transistor includes a second gate and a second drain,
the second gate is coupled to the connection node,
the second drain is configured to output the second output signal,
the first end of the first switch is coupled to the connection node and the second gate, and
the second end of the first switch is coupled to the voltage generator.

5. The photodetection device according to claim 1, wherein
the first-stage amplifier circuit further includes a second switch configured to couple the first gate and the first drain based on the second switch being turned on,
the first switch is further configured to decrease the specific impedance at the connection node based on the first switch being turned on in a second period,
the second period includes a specific time which the second switch is turned off.

6. The photodetection device according to claim 1, wherein
the pixel is further configured to output the pixel signal,
the pixel signal corresponds to a pixel voltage in a second period,
the pixel voltage corresponds to a reset voltage in the first period and a second amount of received light in the second period,
the first transistor has reference voltage, as a gate voltage, in a third period,
the third period is a period after the first period ends,
the gate voltage is lower than the reference voltage, and
the first switch is further configured to set the specific voltage at the connection node to fixed voltage based on
the first switch being on at an end of the first period, and
the first switch being off at an end of the third period.

7. The photodetection device according to claim 1, wherein
the first-stage amplifier circuit further includes a first capacitor and a second capacitor,
the first capacitor is configured to receive the reference signal,
the second capacitor is configured to receive the pixel signal,
the first gate is configured to receive the reference signal through the first capacitor, and
the first gate is configured to receive the pixel signal through the second capacitor.

8. The photodetection device according to claim 7, wherein the first drain is coupled to the connection node.

9. The photodetection device according to claim 8, wherein
the first-stage amplifier circuit further includes a first load transistor, and
the first load transistor is coupled to the first drain and the connection node.

10. The photodetection device according to claim 7, further comprising a buffer circuit configured to receive the reference signal, wherein
the buffer circuit is coupled to the first capacitor, and
the first gate is further configured to receive the reference signal through the buffer circuit and the first capacitor.

11. The photodetection device according to claim 1, wherein the first-stage amplifier circuit further includes a third transistor, wherein
the third transistor includes a fourth gate, a fourth drain, and a fourth source, and
the third transistor along with the first transistor corresponds to a differential pair.

12. The photodetection device according to claim 11, wherein the fourth drain is coupled to the connection node.

13. The photodetection device according to claim 12, wherein the first-stage amplifier circuit further includes:
a first load transistor coupled to the first drain, and
a second load transistor coupled to the fourth drain and the connection node.

14. The photodetection device according to claim 1, wherein
the first-stage amplifier circuit further includes a first capacitor,
the first capacitor is configured to receive the reference signal, and the pixel signal,
the first gate is configured to receive the reference signal through the first capacitor, and
the first source is configured to receive the pixel signal.

15. An electronic apparatus, comprising
a photodetection device, wherein the photodetection device includes:
a pixel configured to:
receive light; and
generate a pixel signal in a first period, wherein the pixel signal is associated with a first amount of the received light;
a reference signal generation unit configured to generate a reference signal;
a comparison circuit that includes a first-stage amplifier circuit and a second-stage amplifier circuit, wherein
the second-stage amplifier circuit is coupled to the first-stage amplifier circuit through a connection node,
the first-stage amplifier circuit includes a first transistor,
the first transistor is configured to receive the pixel signal and reference signal,
the comparison circuit is configured to compare the pixel signal and the reference signal based on a control signal;
the first-stage amplifier circuit is configured to output a first output signal based on the comparison between the pixel signal and the reference signal,
the second-stage amplifier circuit is configured to output a second output signal,
the second output signal corresponds to the first output signal; and
a first switch including a first end and a second end, wherein
the first end is coupled to the connection node, and
the first switch is configured to change a specific impedance and a specific voltage at the connection node based on the control signal.

* * * * *